US009564262B2

(12) United States Patent
Ito et al.

(10) Patent No.: US 9,564,262 B2
(45) Date of Patent: Feb. 7, 2017

(54) SUPERCONDUCTING MAGNETIC FIELD GENERATING DEVICE, SUPERCONDUCTING MAGNETIC FIELD GENERATING METHOD, AND NUCLEAR MAGNETIC RESONANCE APPARATUS

(71) Applicant: AISIN SEIKI KABUSHIKI KAISHA, Kariya-shi (JP)

(72) Inventors: Yoshitaka Ito, Takahama (JP); Yousuke Yanagi, Chiryu (JP); Masaaki Yoshikawa, Kariya (JP)

(73) Assignee: AISIN SEIKI KABUSHIKI KAISHA, Kariya-shi (JP)

( * ) Notice: Subject to any disclaimer, the term of this patent is extended or adjusted under 35 U.S.C. 154(b) by 0 days.

(21) Appl. No.: 14/743,338

(22) Filed: Jun. 18, 2015

(65) Prior Publication Data
US 2015/0369885 A1    Dec. 24, 2015

(30) Foreign Application Priority Data

Jun. 20, 2014  (JP) .................................. 2014-127301

(51) Int. Cl.
*H01F 6/00* (2006.01)
*H01F 6/04* (2006.01)
(Continued)

(52) U.S. Cl.
CPC ............... *H01F 6/04* (2013.01); *G01R 33/387* (2013.01); *G01R 33/3815* (2013.01)

(58) Field of Classification Search
CPC ................... H01F 6/00–6/065; G01R 33/381; G01R 33/3815; G01R 33/34023; G01R 33/387; G01R 33/3812
(Continued)

(56) References Cited

U.S. PATENT DOCUMENTS 5,204,315 A  *  4/1993  Ito ......................... H01L 39/248
                                                                       419/3
5,539,366 A  *  7/1996  Dorri .................. G01R 33/3806
                                                                       324/318
(Continued)

FOREIGN PATENT DOCUMENTS

JP        2002-006021        1/2002
JP        2008-034692        2/2008
(Continued)

*Primary Examiner* — Shawki S Ismail
*Assistant Examiner* — Lisa Homza
(74) *Attorney, Agent, or Firm* — Oblon, McClelland, Maier & Neustadt, L.L.P.

(57) ABSTRACT

A superconducting magnetic field generating device includes: a superconductor including an outer superconductor formed with a high temperature superconducting material in a cylindrical shape and generating a trapped magnetic field, and an inner superconductor formed with a high temperature superconducting material in a cylindrical shape and coaxially disposed with the outer superconductor on the inner circumferential side; and a cooling device cooling the outer and inner superconductors to a temperature equal to or lower than the superconducting transition temperature, wherein the inner superconductor is formed so that a ratio $(Jc\theta 1/Jcz1)$ of a critical current density $(Jc\theta 1)$ of the inner superconductor in the circumferential direction to a critical current density $(Jcz1)$ of the inner superconductor in the axial direction is closer to 1 than a ratio $(Jc\theta 2/Jcz2)$ of the critical current density $(Jc\theta 2)$ in the circumferential direction to a critical current density $(Jcz2)$ of the outer superconductor of the outer superconductor in the axial direction.

13 Claims, 21 Drawing Sheets

(51) Int. Cl.
*G01R 33/3815* (2006.01)
*G01R 33/387* (2006.01)

(58) Field of Classification Search
USPC .......................................................... 335/216
See application file for complete search history.

(56) References Cited

U.S. PATENT DOCUMENTS

| | | | | |
|---|---|---|---|---|
| 5,565,831 A * | 10/1996 | Dorri | .................. | G01R 33/3806 324/318 |
| 5,659,277 A * | 8/1997 | Joshi | ......................... | H01F 6/06 324/318 |
| 5,659,278 A * | 8/1997 | Yanagi | .................... | H01F 6/008 335/216 |
| 5,757,257 A * | 5/1998 | Doi | .......................... | H01L 39/20 324/318 |
| 5,874,882 A * | 2/1999 | Laskaris | ............. | G01R 33/3806 324/318 |
| 6,010,284 A * | 1/2000 | Ito | ........................... | B23B 41/12 408/108 |
| 6,111,490 A * | 8/2000 | Yanagi | .................... | H01F 13/00 335/216 |
| 6,169,402 B1 * | 1/2001 | Oka | ................... | G01R 33/3815 324/318 |
| 6,489,769 B2 | 12/2002 | Nakamura et al. | | |
| 2002/0000806 A1 * | 1/2002 | Nakamura | .......... | G01R 33/3815 324/315 |
| 2002/0000807 A1 * | 1/2002 | Nakamura | .......... | G01R 33/3815 324/315 |
| 2002/0130747 A1 * | 9/2002 | Ito | .............................. | H01F 6/00 335/299 |
| 2004/0212364 A1 * | 10/2004 | Morita | ............. | G01R 33/34007 324/318 |
| 2005/0030017 A1 * | 2/2005 | Ito | ........................... | C23C 14/35 324/248 |
| 2011/0257017 A1 * | 10/2011 | Park | .................... | G01R 33/3815 505/162 |
| 2013/0012392 A1 * | 1/2013 | Tanaka | .................... | H01F 6/008 505/162 |
| 2015/0369885 A1 * | 12/2015 | Ito | ....................... | G01R 33/3815 505/162 |

FOREIGN PATENT DOCUMENTS

JP    2009-156719    7/2009
JP    2014-053479    3/2014

* cited by examiner $Jcr2 \cong Jc\theta 2 > Jcz2$

SUPERCONDUCTING MAGNETIC FIELD GENERATING DEVICE, SUPERCONDUCTING MAGNETIC FIELD GENERATING METHOD, AND NUCLEAR MAGNETIC RESONANCE APPARATUS

CROSS REFERENCE TO RELATED APPLICATIONS

This application is based on and claims priority under 35 U.S.C. §119 to Japanese Patent Application 2014-127301, filed on Jun. 20, 2014, the entire contents of which are incorporated herein by reference.

TECHNICAL FIELD

This disclosure relates to a superconducting magnetic field generating device, a superconducting magnetic field generating method, and a nuclear magnetic resonance apparatus.

BACKGROUND DISCUSSION

Nuclear magnetic resonance (NMR) is a resonance phenomenon of energy of a nuclear spin (magnetic moment) generated when an electromagnetic wave is applied to a sample placed in a strong magnetic field. A nuclear magnetic resonance apparatus (NMR apparatus) is a machine which analyzes a structure of a sample using such a resonance phenomenon. As magnetic field strength increases, sensitivity and resolution of an NMR signal increase, and accordingly, a magnetic field generating device for generating a strong magnetic field is included in the NMR apparatus.

As the magnetic field generating device which generates a strong magnetic field, a superconducting magnetic field generating device which generates a magnetic field by magnetizing a superconductor has been disclosed. As the superconductor included in the superconducting magnetic field generating device, it is preferable to use a high-temperature superconductor which has a high superconducting transition temperature and comparatively easily performs cooling.

A sample is placed in a magnetic field when analyzing a molecular structure of a sample using the NMR apparatus. At that time, when variation in magnetic field strength is great depending on location, the obtained NMR spectrum becomes broad and it is difficult to suitably identify the molecular structure of a sample. Accordingly, the superconducting magnetic field generating device used in the NMR apparatus is preferably configured so as to generate a strong magnetic field and to form a magnetic field (homogeneous magnetic field) having a uniform magnetic field strength in a measurement space of the sample.

Uniformity of a magnetic field equal to or smaller than 1 ppm is required for high resolution NMR measurement. In general, a magnetic field having extremely high uniformity which is equal to or smaller than 1 ppm can be achieved by adding a plurality of shim coils (magnetic field correcting coils) to the superconducting magnetic field generating device. That is, the uniformity of the magnetic field generated by the superconducting magnetic field generating device should be at least correctable ppm order using the shim coils.

The superconductor included in the superconducting magnetic field generating device used in the NMR apparatus is, for example, formed in a cylindrical shape. In this case, the magnetic field (applied magnetic field) is applied to the superconductor by an external magnetic field generating device, so that a magnetic field, through which a magnetic flux passes in an axial direction, is generated in an inner circumferential space (bore) of a cylindrical superconductor. The superconductor is cooled to a temperature equal to or lower than the superconducting transition temperature, while the magnetic field is applied thereto. After completing cooling, the applied magnetic field generated by the external magnetic field generating device is removed. By doing so, the superconductor is magnetized so as to maintain the applied magnetic field and a supercurrent is induced into the superconductor. By flowing the supercurrent into the superconductor as described above, a magnetic field (trapped magnetic field), through which a magnetic flux passes in an axial direction, is formed in the bore of the superconductor. A space (room temperature bore space) for placing a sample is formed in the bore of the superconductor in which the trapped magnetic field is formed. A weak electromagnetic wave is emitted from the sample, by applying an electromagnetic wave to the sample placed in the room temperature bore space. By detecting this electromagnetic wave, the NMR spectrum is obtained.

As shown in FIG. 21, in order to improve accuracy of analysis of the sample, the trapped magnetic field formed in the bore of the cylindrical superconductor may have an axisymmetric magnetic field strength distribution (that is, the same magnetic field strength distribution in any direction orthogonal to a central axis of the cylindrical superconductor) and may have a uniform magnetic field strength in the central portion (space where the sample is placed). In order to obtain such a trapped magnetic field, the supercurrent flowing through the magnetized superconductor should be a circular current flowing in a circumferential direction by setting the central axis of the cylindrical superconductor as a center. That is, it is necessary to form a ring-shaped and concentric circular supercurrent loop shown in a cross section which is orthogonal to the axial direction of the superconductor in the superconductor, in order to form the trapped magnetic field having the axisymmetric magnetic field strength distribution and uniform magnetic field strength in the central portion in the bore of the superconductor. However, when a material structure or superconducting characteristics of the superconductor used are not uniform, the supercurrent loop is formed in a deformed shape which is different from the concentric circular shape. That is, the supercurrent loop is disordered. When the supercurrent loop is disordered, the axial symmetry of the magnetic field in the bore of the superconductor breaks down and the uniformity deteriorates, and accordingly, it is difficult to form the trapped magnetic field having the axisymmetric magnetic field strength distribution and uniform magnetic field strength in the central portion in the bore of the superconductor. Therefore, the material structure or the superconducting characteristics of the superconductor are preferably uniform.

As the high-temperature superconductor, an RE—Ba—Cu—O based (RE is a rare earth element containing Y) superconducting bulk manufactured by a fusion method is well known. However, such a superconducting bulk has the following properties which cause disordering of the supercurrent loop (hereinafter, referred to as non-uniformity characteristics).

(1) Since the superconducting bulk is manufactured by allowing single crystal growth from a seed crystal loaded on the superconductor, the superconducting bulk has a crystal growth boundary. For example, when the superconducting bulk is manufactured by allowing crystal growth from a seed crystal loaded so that a c surface of a crystal structure comes into contact with the upper portion of the superconductor, the seed crystal grows in a cross shape in the center in a top view, and accordingly, a cross-shaped crystal growth boundary is formed in the superconducting bulk. When the superconducting bulk formed as described above is magnetized, the shape of the supercurrent loop formed in the superconducting bulk is a square which connects adjacent crystal growth boundaries. That is, the supercurrent loop is disordered due to the supercurrent flowing thus expanding outside of the crystal growth boundary portion, and the concentric circular supercurrent loop is not formed. As a result, the axial symmetry of the trapped magnetic field formed in the bore of the superconductor breaks down and the uniformity deteriorates.

(2) The superconducting bulk as the high-temperature superconductor has a structure in which a non-superconducting phase is finely dispersed in a superconducting phase of the single crystal. The non-superconducting phase forms a pinning point for trapping a strong magnetic field, but there are variations in a size or distribution of the non-superconducting phase, and the supercurrent loop formed in the superconducting bulk is disordered due to such variations.

(3) The superconducting bulk has a material structure with non-uniform characteristics such as vacancies, unnecessary precipitates, presence or absence of microcracks, or disordered crystallinity. The supercurrent loop formed in the superconducting bulk is disordered due to such a material structure with non-uniform characteristics.

(4) The superconducting bulk has local variations in superconducting characteristics (superconducting transition temperature Tc, critical current density Jc, and the like). The supercurrent loop is also disordered due to this.

Accordingly, when using the superconducting bulk in the high-temperature superconductor included in the superconducting magnetic field generating device, the supercurrent loop is disordered due to the non-uniformity characteristics described above, and thus, it is difficult to form the uniform trapped magnetic field in the bore of the cylindrical superconductor, even when the applied magnetic field is uniform.

JP 2008-034692A (Reference 1) discloses a superconducting magnetic field generating device including a cylindrical superconductor which is configured by coaxially arranging superconducting bulks having a cylindrical shape and small magnetic susceptibility on both end surfaces of a superconducting bulk having a cylindrical shape and large magnetic susceptibility. According to the superconducting magnetic field generating device disclosed in Reference 1, it is possible to form a trapped magnetic field having uniform magnetic field strength in an axial direction of the superconductor in the bore of the superconductor, by designing the superconducting bulks so that the magnetic susceptibility and the shape of the superconducting bulks satisfy certain conditions.

JP 2009-156719A (Reference 2) discloses a superconducting magnetic field generating device including a correction coil which is disposed around a circumference of a superconductor formed of cylindrical superconducting bulks. According to the superconducting magnetic field generating device disclosed in Reference 2, it is possible to form a trapped magnetic field having uniform magnetic field strength in an axial direction of the superconductor in the bore of the superconductor, by correcting the applied magnetic field using the correction coil when performing magnetizing by applying a magnetic field to the superconductor.

JP 2014-053479A (Reference 3) discloses a superconducting magnetic field generating device including a cylindrical superconductor which is formed so that an inner diameter of the central portion in an axial direction is greater than an inner diameter of an end portion. According to the superconducting magnetic field generating device disclosed in Reference 3, a magnetic field flows into the bore of the superconductor so as to offset a non-uniform magnetic field generated by magnetization of the superconductor, by setting the inner diameter of the central portion of the cylindrical superconductor in the axial direction to be greater than the inner diameter of the end portion thereof. By removing the non-uniform magnetic field as described above, it is possible to form the trapped magnetic field having uniform magnetic field strength in the superconductor in the axial direction in the bore of the superconductor.

According to the superconducting magnetic field generating devices disclosed in Reference 1, Reference 2, and Reference 3, it is possible to increase the uniformity in the magnetic field strength in the bore of the superconductor in the axial direction, but in principle, it is difficult to increase the uniformity in the magnetic field strength in a circumferential direction. Accordingly, it is difficult to set the magnetic field strength in the bore of the superconductor, particularly in the measurement space (room temperature bore space) of the sample formed in the central portion of the bore to be sufficiently uniform.

SUMMARY

Thus, a need exists for a superconducting magnetic field generating device which is not suspectable to the drawback mentioned above.

An aspect of this disclosure provides a superconducting magnetic field generating device including: a superconductor which includes an outer superconductor which is formed of a high temperature superconducting material in a cylindrical shape and generates a trapped magnetic field by trapping an applied magnetic field in a state of being cooled to a temperature equal to or lower than a superconducting transition temperature, and an inner superconductor which is formed with a high temperature superconducting material in a cylindrical shape and is coaxially disposed with the outer superconductor on the inner circumferential side of the outer superconductor, and a cooling device which cools the outer superconductor and the inner superconductor to a temperature equal to or lower than the superconducting transition temperature, in which the inner superconductor is formed so that a ratio ($Jc\theta1/Jcz1$) of a critical current density ($Jc\theta1$) of the inner superconductor in the circumferential direction to a critical current density ($Jcz1$) of the inner superconductor in the axial direction is closer to 1 than a ratio ($Jc\theta2/Jcz2$) of the critical current density ($Jc\theta2$) in the circumferential direction to a critical current density ($Jcz2$) of the outer superconductor in the axial direction. Herein, the critical current density of the cylindrical superconductor (outer superconductor and inner superconductor) in the axial direction means a critical current density of a supercurrent flowing through the superconductor along the axial direction thereof, the critical current density thereof in the circumferential direction means a critical current density of a supercurrent flowing through the superconductor along the circumferential direction thereof, and the critical current density thereof in the radial direction means a critical current density of a supercurrent flowing through the superconductor along the radial direction thereof.

Another aspect of this disclosure provides a superconducting magnetic field generating method of generating a magnetic field using a superconductor which includes an outer superconductor which is formed with a high temperature superconducting material in a cylindrical shape and an inner superconductor which is formed with a high temperature superconducting material in a cylindrical shape and is coaxially disposed with the outer superconductor on the inner circumferential side of the outer superconductor, the method including: a magnetic field applying step of applying a magnetic field to the outer superconductor and the inner superconductor so that a magnetic flux passes through an inner circumferential space of the inner superconductor along the axial direction of the outer superconductor and the inner superconductor, a cooling step of cooling the outer superconductor and the inner superconductor to which the magnetic field is applied in the magnetic field applying step to a target temperature which is equal to or lower than a lower temperature among a superconducting transition temperature Tco of the outer superconductor and a superconducting transition temperature Tci of the inner superconductor, and a magnetic field trapping step of causing the superconductor to trap the applied magnetic field by removing the magnetic field applied to the outer superconductor and the inner superconductor which are cooled to the target temperature, in which the inner superconductor is formed so that a ratio ($Jc\theta1/Jcz1$) of a critical current density ($Jc\theta1$) in the circumferential direction to a critical current density ($Jcz1$) of the inner superconductor in the axial direction is closer to 1 than a ratio ($Jc\theta2/Jcz2$) of the critical current density ($Jc\theta2$) in the circumferential direction to a critical current density ($Jcz2$) of the outer superconductor in the axial direction.

including the superconducting magnetic field generating device according to this disclosure.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

First Embodiment

Figure 1:
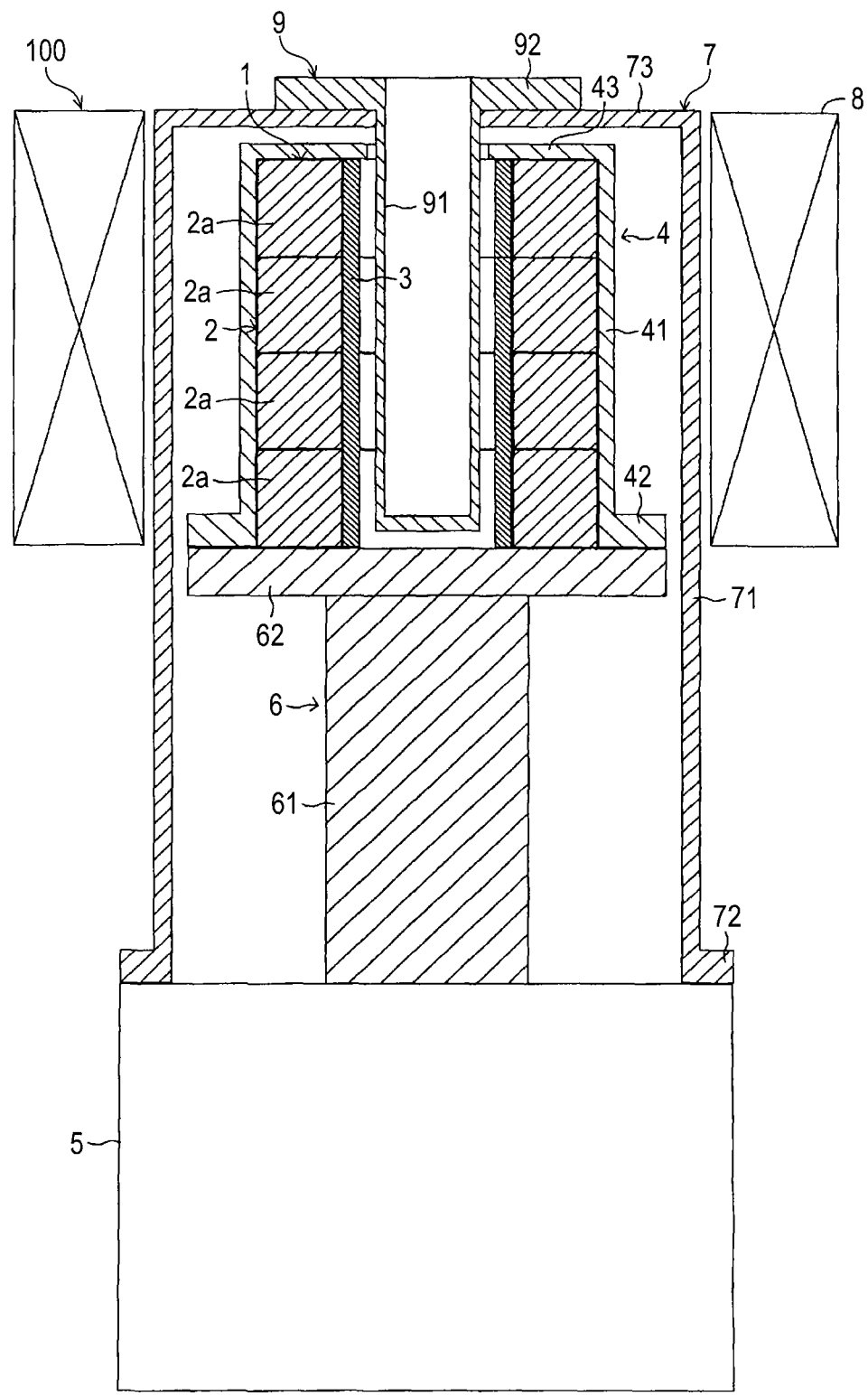
FIG. 1 is a schematic view showing a cross section of a superconducting magnetic field generating device according to a first embodiment which is taken along a plane including a central line in the vertical direction.

Hereinafter, a first embodiment disclosed here will be described. FIG. 1 is a schematic view showing a cross section of a superconducting magnetic field generating device 100 according to the first embodiment which is taken along a plane including a central line in the vertical direction. As shown in FIG. 1, the superconducting magnetic field generating device 100 includes a superconductor 1, a holder 4, a cooling device 5, a cold head 6, a vacuum insulation container 7, and an external magnetic field generating coil 8 (external magnetic field generating device).

The cooling device 5 may be in any form as long as it can generate a low temperature equal to or lower than a superconducting transition temperature Tc (for example, 90 K) of a high temperature superconductor, for example, a low temperature around 50 K. As the cooling device 5, a pulse tube refrigerator, a GM refrigerator, and a Stirling refrigerator can be exemplified. The cooling device 5 is preferably a device which generates cold heat by performing a refrigerating cycle operation, but the cooling device may be a substance which can provide a temperature equal to or lower than the superconducting transition temperature Tc of the high temperature superconductor, such as liquid nitrogen.

The cold head 6 is formed with a non-magnetic material having high thermal conductivity, for example, copper or the like. The cold head 6 includes a columnar connection portion 61 and a planar stage portion 62. One end portion of the connection portion 61 comes into contact with a low temperature generation portion of the cooling device 5. For example, when the cooling device 5 is a pulse tube refrigerator, the connection portion 61 comes into contact with a low temperature end portion of a cold storage tube, and when the cooling device 5 is a GM refrigerator, the connection portion 61 comes into contact with a cylinder portion which forms an expansion space. In FIG. 1, the connection portion 61 is provided on the upper side of the cooling device 5. The planar stage portion 62 is continuously formed on the upper end (the other end portion) of the connection portion 61.

The superconductor 1 and the holder 4 are loaded on the stage portion 62. As shown in FIG. 1, the superconductor 1 includes an outer superconductor 2 and an inner superconductor 3. The outer superconductor 2 is formed in a cylindrical shape by stacking a plurality of ring-shaped superconducting bulks 2a along an axial direction. The cylindrical outer superconductor 2 may be configured with one superconducting bulk. One end surface of the cylindrical outer superconductor 2 is loaded on the stage portion 62 of the cold head 6.

The inner superconductor 3 is arranged on an inner circumferential side of the outer superconductor 2. The inner superconductor 3 is also formed in a cylindrical shape, in the same manner as that of the outer superconductor 2. One end surface of the cylindrical inner superconductor 3 is loaded on the stage portion 62. The inner superconductor 3 is coaxially disposed on the inner circumferential side of the outer superconductor 2. That is, a central axis of the outer superconductor 2 and a central axis of the inner superconductor 3 coincide with each other. In this case, the outer circumferential surface of the inner superconductor 3 may or may not come into contact with the inner circumferential surface of the outer superconductor 2.

The outer superconductor 2 and the inner superconductor 3 are second type superconductors and are formed with a high temperature superconducting material. In the embodiment, the outer superconductor 2 is an RE—Ba—Cu—O based (RE is a rare earth containing Y) superconductor and is formed by a well-known fusion method. The outer superconductor 2 is a high temperature superconductor having a layered crystal structure having a c axis direction as a lamination direction (direction orthogonal to a layer) and is formed by allowing crystal growth from a seed crystal so that the c axis direction of the crystal structure coincides with an axial direction of the outer superconductor 2. The inner superconductor 3 is a high temperature superconductor having a layered crystal structure having a c axis direction as a lamination direction (direction orthogonal to a layer) and is formed so that the c axis direction of the crystal structure coincides with a radial direction of the inner superconductor 3.

The holder 4 includes a cylindrical main body portion 41 which has substantially the same inner diameter as the outer diameter of the outer superconductor 2, a fixing portion 42 which is formed in a ring shape by extending in a radial shape from the lower end to radially outside of the main body portion 41 in FIG. 1, and an end surface portion 43 which is formed in a ring shape by extending in a radial shape from the upper end to radially inside of the main body portion 41 in FIG. 1, and the holder exhibits a substantially bottomed tubular shape. The superconductor 1 (outer superconductor 2 and inner superconductor 3) is arranged in an inner circumferential space of the main body portion 41 of the holder 4. Since the fixing portion 42 of the holder 4 is connected to the stage portion 62, the holder 4 is fixed onto the stage portion 62. In a state where the holder 4 is fixed onto the stage portion 62, the outer circumferential surface of the outer superconductor 2 comes into contact with the inner circumferential surface of the main body portion 41 of the holder 4, and the end surface on the upper side of the outer superconductor 2 in FIG. 1 and the end surface on the upper side of the inner superconductor 3 in FIG. 1 come into contact with the lower surface of the end surface portion 43 of the holder 4. By doing so, the outer superconductor 2 and the inner superconductor 3 are held by the holder 4. The holder 4 is also formed with a non-magnetic material having high thermal conductivity, for example, copper or aluminum, in the same manner as that of the cold head 6.

The vacuum insulation container 7 includes a cylindrical main body portion 71 which has an inner diameter greater than the outer diameter of the main body portion 41 of the holder 4, a fixing portion 72 which is formed in a ring shape by extending in a radial shape from the lower end to radially outside of the main body portion 71 in FIG. 1, and a cover portion 73 which is formed in a ring shape by extending in a radial shape from the upper end to radially inside of the main body portion 71 in FIG. 1. The cold head 6, the holder 4, and the superconductor 1 are accommodated in the inner circumferential space of the main body portion 71. The fixing portion 72 is airtightly fixed to the cooling device 5.

As shown in FIG. 1, a cylindrical container 9 is inserted into the inner circumferential space of the vacuum insulation container 7 from a circular opening surrounded by an inner circumferential wall of the cover portion 73 of the vacuum insulation container 7. The cylindrical container 9 includes a bottomed tubular container portion 91 and a lid portion 92 which extends in a radial shape from the opening end to radially outside of the container portion 91, and the lid portion 92 is loaded on the upper surface of the cover portion 73 of the vacuum insulation container 7 in FIG. 1. The container portion 91 is in the bore (inner circumferential space) of the superconductor 1. That is, the container portion 91 is arranged in the bore of the superconductor 1. A sample to be analyzed by the NMR apparatus, for example, is loaded into the space in the container portion 91. The space in the container portion 91 is provided substantially in the center of the bore of the superconductor 1. This space is referred to as a room temperature bore space.

A gap between the outer circumferential surface of the container portion 91 on the upper side portion in FIG. 1 and the inner circumferential surface of the ring-shaped cover portion 73 is airtightly sealed by sealing means (not shown). Accordingly, the opening formed on the cover portion 73 is closed. As described above, the fixing portion 72 of the vacuum insulation container 7 is airtightly fixed to the cooling device 5. Therefore, an enclosed space is formed over the cooling device 5 in FIG. 1 by the vacuum insulation container 7, the cooling device 5, and the cylindrical container 9. The cold head 6, the superconductor 1 (outer superconductor 2 and inner superconductor 3), and the holder 4 are arranged in this enclosed space. The vacuum insulation container 7 is formed with a non-magnetic material such as an aluminum alloy.

As shown in FIG. 1, the external magnetic field generating coil 8 is provided so as to surround the outer circumference of the vacuum insulation container 7. A magnetic field is generated by performing electrical connection with the external magnetic field generating coil 8. The magnetic field generated by performing electrical connection with the external magnetic field generating coil 8 may also be referred to as the applied magnetic field, hereinafter. The applied magnetic field is at least formed in an inner circumferential space of the external magnetic field generating coil 8. Accordingly, the magnetic field is applied to the superconductor 1 with the operation of the external magnetic field generating coil 8. At that time, the magnetic field, through which a magnetic flux passes in the axial direction of the outer superconductor 2 and the inner superconductor 3, is formed in the bore of the superconductor 1, specifically, the inner circumferential space of the inner superconductor 3.

The operation of the superconducting magnetic field generating device 100 having the configurations described above will be described. First, the inside of the enclosed space is exhausted using an exhauster (not shown) and the pressure is reduced so that atmospheric pressure in the enclosed space is in a vacuum state (for example, equal to or smaller than 0.1 Pa). Then, the applied magnetic field is generated by operating the external magnetic field generating coil 8. In this case, as described above, the magnetic field, through which a magnetic flux passes in the axial direction of the outer superconductor 2 and the inner superconductor 3, is formed in the space in the bore of the superconductor 1. The magnetic field is applied to the space in the bore of the superconductor 1 (inner superconductor 3) so that the magnetic field strength distribution is axisymmetrical and the magnetic field strength in the room temperature bore space is uniformly distributed in the radial direction and the axial direction (magnetic field applying step).

The cooling device 5 is operated in a state where the magnetic field is applied to the superconductor 1 with the operation of the external magnetic field generating coil 8. Accordingly, the cold head 6 is cooled and each of the outer superconductor 2 and the inner superconductor 3 loaded on the stage portion 62 of the cold head 6 is further cooled to a temperature equal to or lower than the superconducting transition temperature (cooling step).

In the cooling step, when the outer superconductor 2 and the inner superconductor 3 are cooled to a temperature slightly higher than the higher temperature of a superconducting transition temperature Tco of the outer superconductor 2 and a superconducting transition temperature Tci of the inner superconductor 3 (temperature before reaching superconducting Ts>Tco or Tci), the external magnetic field generating coil 8 is controlled to adjust the applied magnetic field so that the uniform magnetic field having the uniform magnetic field strength distribution in the axial direction and the radial direction of the superconductor 1 is formed in the room temperature bore space (magnetic field adjustment step). By performing this magnetic field adjustment step, the effect of the change in magnetization generated in the superconductor 1 before that point which is applied to the applied magnetic field is cancelled out.

When the temperature of the outer superconductor 2 and the temperature of the inner superconductor 3 are decreased to a temperature equal to or lower than the respective superconducting transition temperatures due to the cooling by the cooling device 5, the state of the outer superconductor 2 and the inner superconductor 3 becomes a superconducting state. At that time, that is, when the temperature of the outer superconductor 2 and the temperature of the inner superconductor 3 are equal to or lower than the superconducting transition temperatures, the operation of the external magnetic field generating coil 8 is stopped and the applied magnetic field is removed. By doing so, a supercurrent is induced into the outer superconductor 2 so as to restore the state of the magnetic field with the change in the magnetic field strength accompanied by the removal of the applied magnetic field. The supercurrent induced as described above flows through the outer superconductor 2 and accordingly, the magnetic field is generated. That is, the outer superconductor 2 is magnetized. Specifically, the magnetic field generated by the magnetization of the outer superconductor 2 is the same magnetic field as the applied magnetic field generated with the operation of the external magnetic field generating coil 8. That is, by causing the supercurrent to flow to the outer superconductor 2, the outer superconductor 2 traps the applied magnetic field generated with the operation of the external magnetic field generating coil 8 (magnetic field trapping step). The magnetic field is generated in the bore of the superconductor 1 by trapping the applied magnetic field by the outer superconductor 2. The magnetic field generated with the trapping of the magnetic field is also referred to as a trapped magnetic field.

Figure 2:
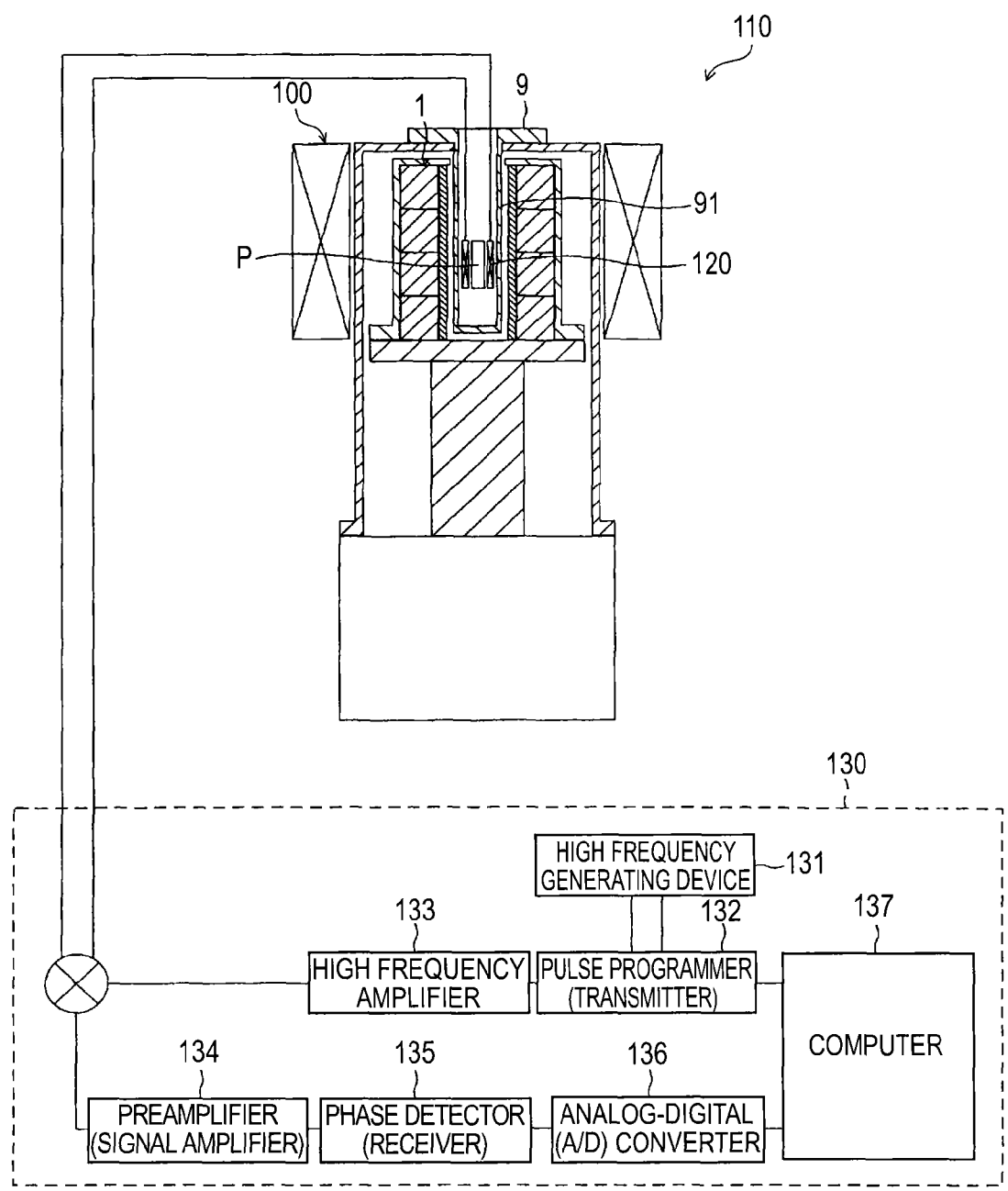
FIG. 2 is a diagram showing a schematic configuration of a nuclear magnetic resonance apparatus.

Next, the nuclear magnetic resonance apparatus using the trapped magnetic field generated in the superconducting magnetic field generating device 100 will be briefly described. FIG. 2 is a diagram showing a schematic configuration of a nuclear magnetic resonance apparatus 110. The nuclear magnetic resonance apparatus 110 includes the superconducting magnetic field generating device 100, a detecting coil 120, and analysis means 130. The detecting coil 120 is arranged in the container portion 91 (in room temperature bore space) of the cylindrical container 9 arranged in the bore of the superconductor 1. A sample P to be measured is arranged on the inner circumferential side of the detecting coil 120. The analysis means 130 includes a high frequency generating device 131, a pulse programmer (transmitter) 132, a high frequency amplifier 133, a preamplifier (signal amplifier) 134, a phase detector 135, an analog-digital (A/D) converter 136, and a computer 137.

When the superconducting magnetic field generating device 100 is operated, the trapped magnetic field is formed in the bore of the superconductor 1 as described above. Then, by adjusting the trapped magnetic field with a shim coil (not shown), the uniformity in the magnetic field strength of the trapped magnetic field is increased. At that time, the trapped magnetic field is adjusted by the shim coil so that the uniformity in the magnetic field strength in the room temperature bore space is equal to or smaller than 1 ppm. The sample P is placed in the room temperature bore space where the uniformity in the magnetic field strength is increased. In this state, the high frequency generating device 131 is operated. By doing so, the high frequency pulse generated by the high frequency generating device 131 is electrically transmitted to the detecting coil 120 through the pulse programmer 132 and the high frequency amplifier 133, and a pulse electromagnetic wave (radio wave) is emitted to the sample P. A minute current flows to the detecting coil 120 provided around the sample P due to nuclear magnetic resonance occurring when the radio wave is emitted to the sample P placed in the magnetic field. A signal representing this minute current (NMR signal) is delivered to the computer 137 through the preamplifier 134, the phase detector 135, and the A/D converter 136. The computer 137 calculates an NMR spectrum based on the delivered NMR signal. A molecular structure of the sample P is obtained by analyzing the obtained NMR spectrum.

As will be described later, when the superconducting magnetic field generating device 100 according to the embodiment is used, the uniformity of the trapped magnetic field generated in the room temperature bore space is high. Accordingly, a peak of the NMR spectrum obtained from the minute current detected by the detecting coil 120 is clear. Therefore, accuracy of analysis of the molecular structure of the sample P is improved.

Figure 3:
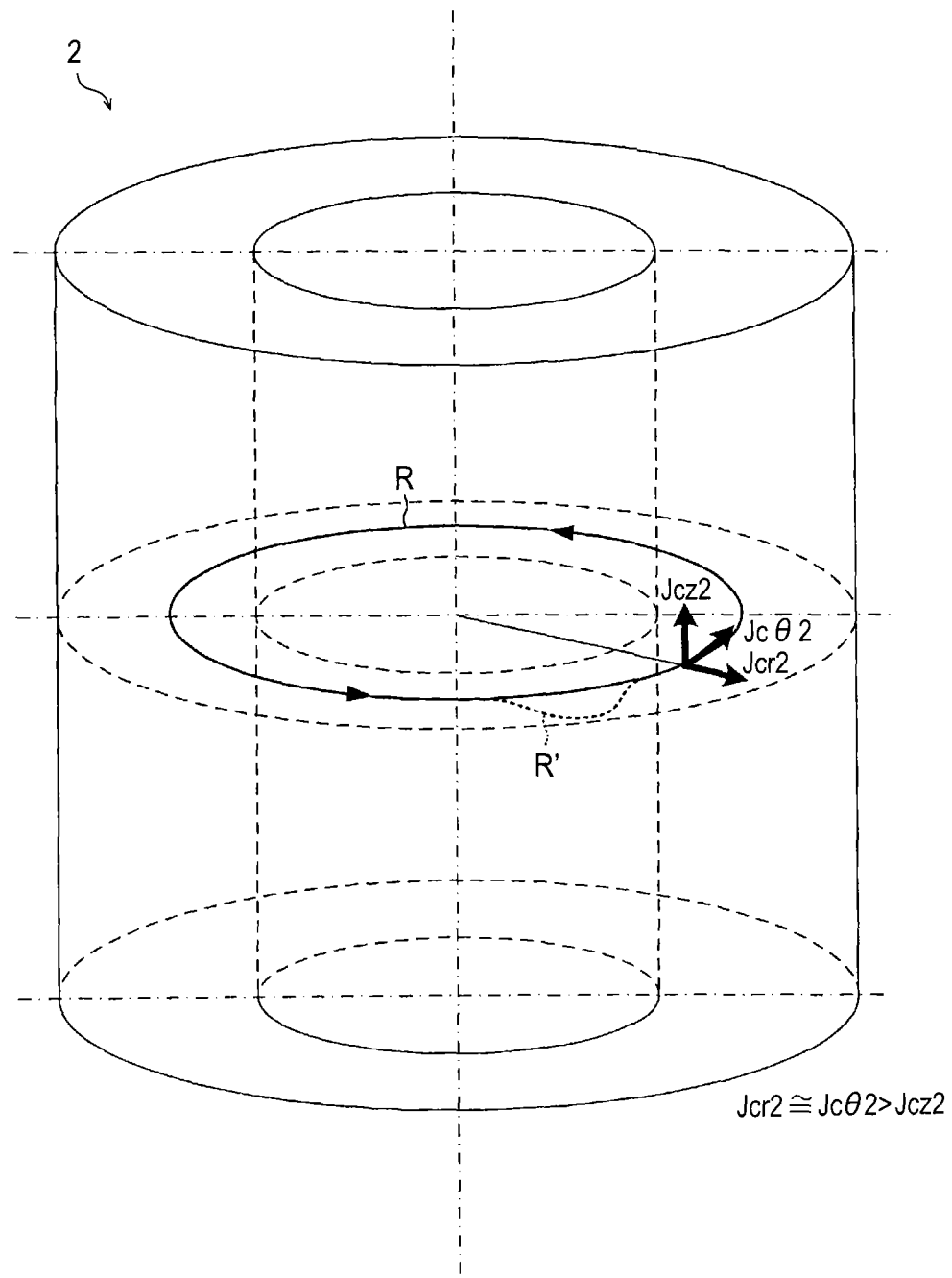
FIG. 3 is a diagram schematically showing a supercurrent flowing to an outer superconductor, when a trapped magnetic field is generated in a bore of a superconductor by the superconducting magnetic field generating device according to the first embodiment.

Next, the supercurrent flowing to the outer superconductor 2 when the trapped magnetic field is generated by the superconducting magnetic field generating device 100 will be described. FIG. 3 is a diagram schematically showing the supercurrent flowing to the outer superconductor 2, when the trapped magnetic field is generated in the bore of the superconductor 1 by the superconducting magnetic field generating device 100. As described above, since the applied magnetic field is formed in the space in the bore of the superconductor 1 so as to cause the magnetic flux to flow in the axial direction of the outer superconductor 2 and the inner superconductor 3, the trapped magnetic field is also formed so that the magnetic flux flows in the same manner. The trapped magnetic field described above is maintained by continuously causing the supercurrent to flow around the central axis of the outer superconductor 2 along the circumferential direction. At that time, the supercurrent forms the circular supercurrent loop around the central axis of the outer superconductor 2. By forming the circular supercurrent loop, the trapped magnetic field is formed so that the magnetic flux flows through the bore of the superconductor 1 in the axial direction.

In general, the supercurrent starts to flow from radially outside of the cylindrical superconductor. As the supercurrent increases, the supercurrent also starts to flow to radially inside of the superconductor. The size of the supercurrent is proportional to the size of the trapped magnetic field. Accordingly, when the trapped magnetic field is extremely great, the supercurrent for forming the trapped magnetic field also flows to the inner superconductor 3, not only the outer superconductor 2. However, in the embodiment, in theory, a trapped magnetic field having the same size as that of the applied magnetic field is configured to be obtained by causing the supercurrent to flow only to the outer superconductor 2. That is, the size of the applied magnetic field is set to be smaller than the size of the magnetic field formed when the theoretically greatest supercurrent can flow to the outer superconductor 2.

When the magnetic field having an axisymmetric magnetic field strength distribution and uniform magnetic field strength in the central portion (room temperature bore space) is applied into the bore of the superconductor 1 by the external magnetic field generating coil 8, the supercurrent loop formed on the outer superconductor 2 for obtaining the trapped magnetic field which is the same as the applied magnetic field described above describes an outer circumferential (or inner circumferential) or concentric circle of the outer superconductor 2 along the circumferential direction of the outer superconductor 2 around the central axis in the cross section orthogonal to the central axis of the outer superconductor 2. FIG. 3 shows such an ideal supercurrent loop R.

When the material properties and the superconducting characteristics of the outer superconductor 2 are completely uniform, the ideal supercurrent loop R shown in FIG. 3 will be formed. However, since the outer superconductor 2 is formed with the superconducting bulks, the outer superconductor has non-uniformity characteristics, and there are a portion through which the current easily flows and a portion through which hardly any current flows. The supercurrent flows avoiding the portion through which the current hardly flows. Accordingly, when the superconductor has non-uniformity characteristics, the supercurrent loop may not be formed as the concentric circle described above, but may, with high probability, be formed in a deformed shape. That is, there is a high possibility of the disorder in the supercurrent loop. Accordingly, even when the applied magnetic field formed in the bore of the superconductor 1 has an axisymmetric distribution and the uniform magnetic field strength in the central portion (room temperature bore space), the supercurrent loop actually formed in the outer superconductor 2 is disordered due to the non-uniformity characteristics of the outer superconductor 2. FIG. 3 shows a disordered supercurrent loop R' with a dotted line. The magnetic field obtained by the disordered supercurrent loop is not uniform. Thus, the axial symmetry and the uniformity of the trapped magnetic field are deteriorated.

In the embodiment, the inner superconductor 3 is coaxially provided on the inner side of the outer superconductor 2. When the axial symmetry and the uniformity of the trapped magnetic field are deteriorated due to the disorder in the supercurrent loop formed in the outer superconductor 2, a loop of a supercurrent (correction current) for correcting the trapped magnetic field is formed in the inner superconductor 3. By forming such a correction current loop in the inner superconductor 3, a magnetic field which returns the non-uniform trapped magnetic field formed by the disordered supercurrent loop formed in the outer superconductor 2, to the uniform trapped magnetic field, is formed. As a result, the axial symmetry and the uniformity of the trapped magnetic field are maintained. Therefore, the trapped magnetic field having an axisymmetric magnetic field strength distribution and uniform magnetic field strength in the central portion is formed in the bore of the superconductor 1.

Figure 4:
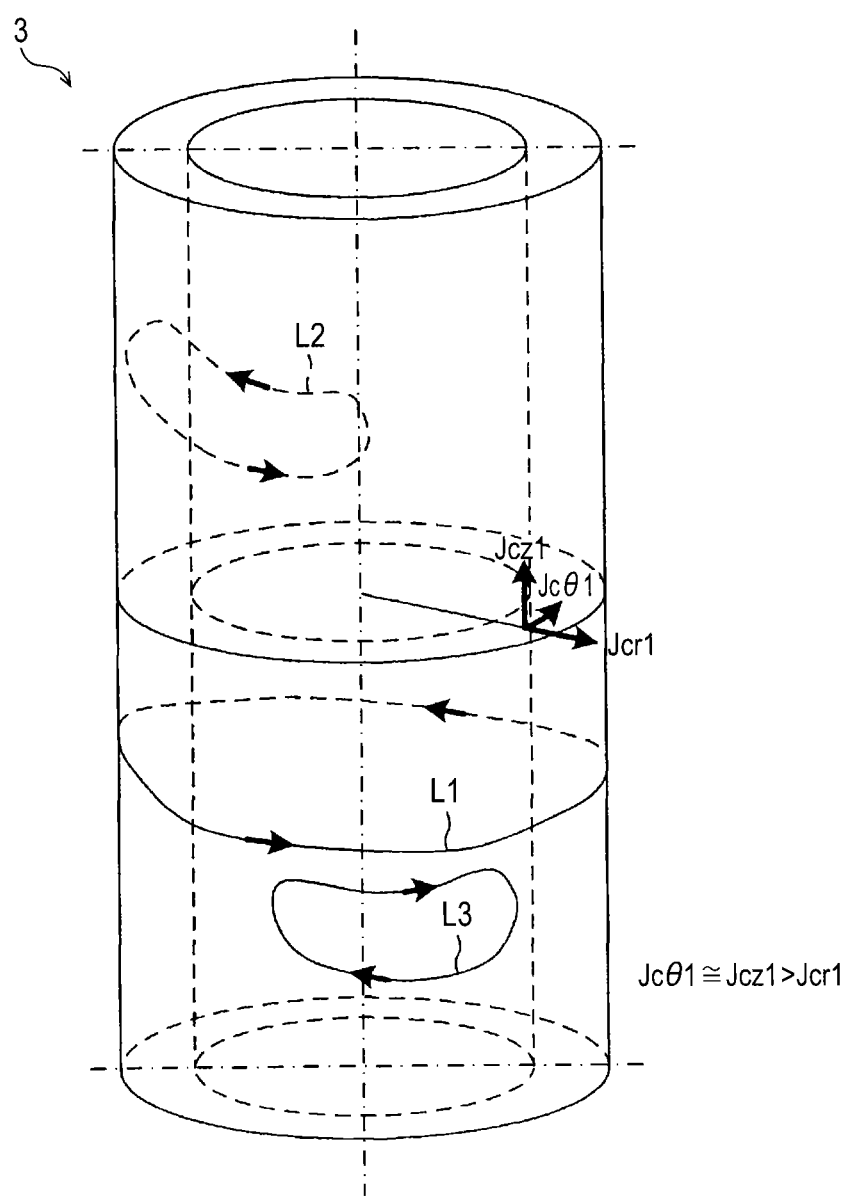
FIG. 4 is a diagram schematically showing a correction current loop which is formed in an inner superconductor in the first embodiment.

FIG. 4 is a diagram schematically showing the correction current loop which is formed in the inner superconductor 3. As shown in FIG. 4, correction current loops L1, L2, and L3 are formed according to the disorder in the supercurrent loop formed in the outer superconductor 2, the shapes thereof change into various forms. In addition, since the disorder in the supercurrent loop formed in the outer superconductor 2 changes three-dimensionally, the shapes of the correction current loops formed in the inner superconductor 3 also change three-dimensionally. For example, the correction current loop which is formed with the supercurrent flowing around the central axis along the circumferential direction so as to be inclined with respect to the central axis, like the correction current loop L1, or the correction current loop which is formed with the supercurrent not moving around the central axis of the inner superconductor 3 but only flowing through a part of a region in a cylindrical circumferential surface in the circumferential direction, like the correction current loops L2 and L3. That is, in the inner superconductor 3, the correction current loop having an arbitrary shape is formed in an arbitrary position in the cylindrical circumferential surface.

A reason for the correction current loop having an arbitrary shape formed in an arbitrary position in the cylindrical circumferential surface of the inner superconductor 3 will be described. A critical current density Jc of the cylindrical superconductor is represented by a critical current density Jcz in the axial direction, a critical current density Jcr in the radial direction, and a critical current density $Jc\theta$ in the circumferential direction. At a certain point, a direction of $Jcz$, a direction of $Jcr$, and a direction of $Jc\theta$ are orthogonal to each other. Accordingly, a surface orthogonal to $Jc\theta$ is defined by $Jcz$ and $Jcr$, a surface orthogonal to $Jcz$ is defined by $Jcr$ and $Jc\theta$, and a surface orthogonal to $Jcr$ is defined by $Jc\theta$ and $Jcz$. The surface orthogonal to $Jcr$ is a cylindrical circumferential surface. That is, the cylindrical circumferential surface is defined by $Jc\theta$ and $Jcz$. Herein, the cylindrical circumferential surface is a surface parallel to the outer circumferential surface and the inner circumferential surface of the cylindrical superconductor, that is, a surface forming a circle which coincides with a circle forming the outer circumference and the inner circumference of the cylindrical superconductor when seen in the axial direction or a concentric circle.

As described above, the inner superconductor 3 is formed so that the c axis direction of the crystal structure coincides with the radial direction. In general, in the superconductor having the layered crystal structure having the c axis direction as a lamination direction (direction orthogonal to a layer), the critical current density in the c axis direction is low and the critical current density in the direction orthogonal to the c axis direction is high. In addition, the critical current density in a plane orthogonal to the c axis direction is substantially equivalent. Accordingly, in the inner superconductor 3, a critical current density $Jcr1$ in the radial direction is low, a critical current density $Jcz1$ in the axial direction and a critical current density $Jc\theta1$ in the circumferential direction are high, and $Jcz1$ and $Jc\theta1$ are substantially equivalent. That is, a relationship of $Jc\theta1 \cong Jcz1 > Jcr1$ is satisfied.

The c axis direction of the crystal structure of the outer superconductor 2 coincides with the axial direction of the outer superconductor 2 as described above. Accordingly, a critical current density $Jcz2$ of a supercurrent flowing in the axial direction of the outer superconductor 2 is smaller than a critical current density $Jcr2$ of a supercurrent flowing in the radial direction of the outer superconductor 2 and a critical current density $Jc\theta2$ of a supercurrent flowing in the circumferential direction thereof. $Jcr2$ and $Jc\theta2$ are substantially equivalent. That is, a relationship of $Jcr2 \cong Jc\theta2 > Jcz2$ is satisfied.

The uniformity in the critical current density in the cylindrical circumferential surface of the cylindrical superconductor can be represented by a ratio of the critical current density $Jc\theta$ in the circumferential direction to the critical current density $Jcz$ in the axial direction ($Jc\theta/Jcz$). As the ratio ($Jc\theta/Jcz$) becomes closer to 1, the critical current density in the cylindrical circumferential surface can be uniform. Herein, in the inner superconductor 3, since $Jcz1$ and $Jc\theta1$ are substantially equivalent, a ratio ($Jc\theta1/Jcz1$) is close to 1. Meanwhile, in the outer superconductor 2, since $Jcz2$ is smaller than $Jc\theta2$, a ratio ($Jc\theta2/Jcz2$) is significantly greater than 1. That is, the ratio ($Jc\theta1/Jcz1$) regarding the critical current density of the inner superconductor 3 is closer to 1 than the ratio ($Jc\theta2/Jcz2$) regarding the critical current density of the outer superconductor 2. That is, a degree of the uniformity in the critical current density in the cylindrical circumferential surface of the inner superconductor 3 is higher than a degree of the uniformity in the critical current density in the cylindrical circumferential surface of the outer superconductor 2.

When the critical current density in the surface is uniform, the supercurrent easily flows into the surface. That is, the supercurrent easily flows into the cylindrical circumferential surface of the inner superconductor 3. Accordingly, the supercurrent loop (correction current loop) having an arbitrary shape is formed in an arbitrary position in the cylindrical circumferential surface of the inner superconductor 3.

The reason for the formation of the trapped magnetic field having an axisymmetric magnetic field strength distribution and uniform magnetic field strength in the central portion in the bore of the superconductor 1 by forming the correction current loop having an arbitrary shape in an arbitrary position in the cylindrical circumferential surface of the inner superconductor 3, will be described. When the magnetic field strength distribution of the applied magnetic field formed in the bore of the superconductor 1 is axisymmetrical and the magnetic field strength of the applied magnetic field in the central portion is uniform, the superconducting loop will be formed so that the trapped magnetic field which is the same as the applied magnetic field is formed in the outer superconductor 2. However, when the supercurrent loop with which the magnetic field which is the same as the applied magnetic field is hardly formed due to the non-uniformity of the outer superconductor 2 is formed in the outer superconductor 2, a magnetic field of a difference between the applied magnetic field and the trapped magnetic field is trapped by the correction current loop formed in the inner superconductor 3. Herein, as described above, the inner superconductor 3 can form the supercurrent loop (correction current loop) having an arbitrary shape in an arbitrary position in the cylindrical circumferential surface, and accordingly, it is possible to form a magnetic field which has arbitrary strength and through which a magnetic flux passes in an arbitrary direction. That is, regardless of the type of the magnetic field of the difference, the supercurrent loop (correction current loop) having an arbitrary shape is formed in an arbitrary position in the cylindrical circumferential surface in the inner superconductor 3, as the magnetic field is formed according to the magnetic field described above. As a result, the non-uniform trapped magnetic field is trapped and the axial symmetry and the uniformity of the trapped magnetic field are maintained. Accordingly, it is possible to form the trapped magnetic field having an axisymmetric magnetic field strength distribution and uniform magnetic field strength in the central portion in the bore of the superconductor 1. Therefore, it is possible to form the trapped magnetic field having uniform magnetic field strength along the axial direction and the radial direction in the room temperature bore space disposed in the central portion of the bore of the superconductor 1.

The ratio ($Jc\theta1/Jcz1$) regarding the inner superconductor 3 is equal to or greater than 0.5 and is preferably equal to or smaller than 2. When the ratio ($Jc\theta1/Jcz1$) is from 0.5 to 2, the correction current loop having an arbitrary shape can be formed in an arbitrary position in the cylindrical circumferential surface of the inner superconductor 3. Accordingly, by forming the correction current loop in the cylindrical circumferential surface of the inner superconductor 3, the trapped magnetic field having an axisymmetric magnetic field strength distribution and uniform magnetic field strength in the central portion is formed in the bore of the superconductor 1.

In the embodiment, the c axis direction of the crystal structure of the cylindrical outer superconductor 2 coincides with the axial direction, and meanwhile, the c axis direction of the crystal structure of the cylindrical inner superconductor 3 coincides with the radial direction. In addition, the direction (through which magnetic flux flows) of the applied magnetic field is the axial direction of the superconductor 1. That is, the magnetic field is applied to the outer superconductor 2 so that the magnetic flux flows in the c axis direction and the magnetic field is applied to the inner superconductor 3 so that the magnetic flux flows in a direction orthogonal to the c axis direction. Herein, the superconductor has a property of the critical current density being decreased due to the application of the magnetic field, and the superconductor also has a property of an amount of decrease in the critical current density changing depending on the application direction of the magnetic field. The amount of the critical current density decreased when the magnetic field is applied so that the magnetic flux flows in a direction orthogonal to the c axis direction, is smaller than a amount of the critical current density decreased when the magnetic field is applied so that the magnetic flux flows in the c axis direction. That is, the decreased amount of the critical current density of the inner superconductor 3 is smaller than the decreased amount of the critical current density of the outer superconductor 2. Accordingly, even when the outer superconductor 2 and the inner superconductor 3 have the same material composition, the critical current density of the inner superconductor 3 is greater than the critical current density of the outer superconductor 2 due to the difference in the c axis direction. As described above, since the critical current density of the inner superconductor 3 is great, it is possible to prevent limitation of the size of the correction current loop due to the critical current density. Accordingly, it is possible to form a suitable correction current loop according to the disorder in the supercurrent loop formed in the outer superconductor 2 in the inner superconductor 3, and as a result, it is possible to more reliably form the trapped magnetic field having an axisymmetric magnetic field strength distribution and uniform magnetic field strength in the central portion.

Second Embodiment

Figure 5:
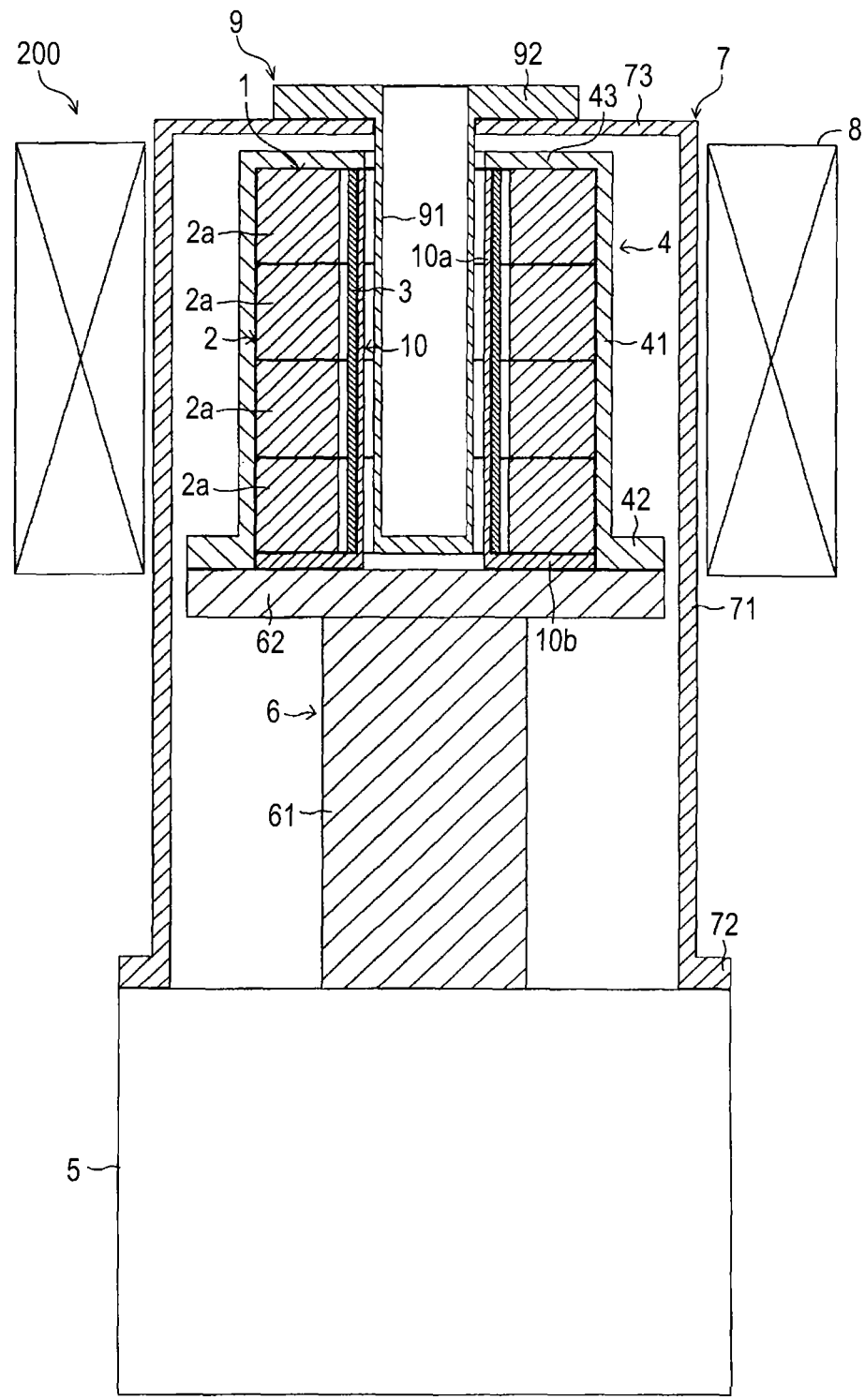
FIG. 5 is a schematic view showing a cross section of a superconducting magnetic field generating device according to a second embodiment which is taken along a plane including a central line in the vertical direction.

Next, a second embodiment will be described. FIG. 5 is a schematic view showing a cross section of a superconducting magnetic field generating device 200 according to the second embodiment which is taken along a plane including a central line in the vertical direction. The superconducting magnetic field generating device 200 is basically the same as the superconducting magnetic field generating device 100 according to the first embodiment, except for inclusion of a cylindrical base material 10 and formation of the inner superconductor 3 on an outer surface of the cylindrical base material 10. Therefore, the same reference numerals are used for the same components as the components of the superconducting magnetic field generating device 100 of FIG. 1 described in the first embodiment and the description thereof will be omitted.

Figure 6:
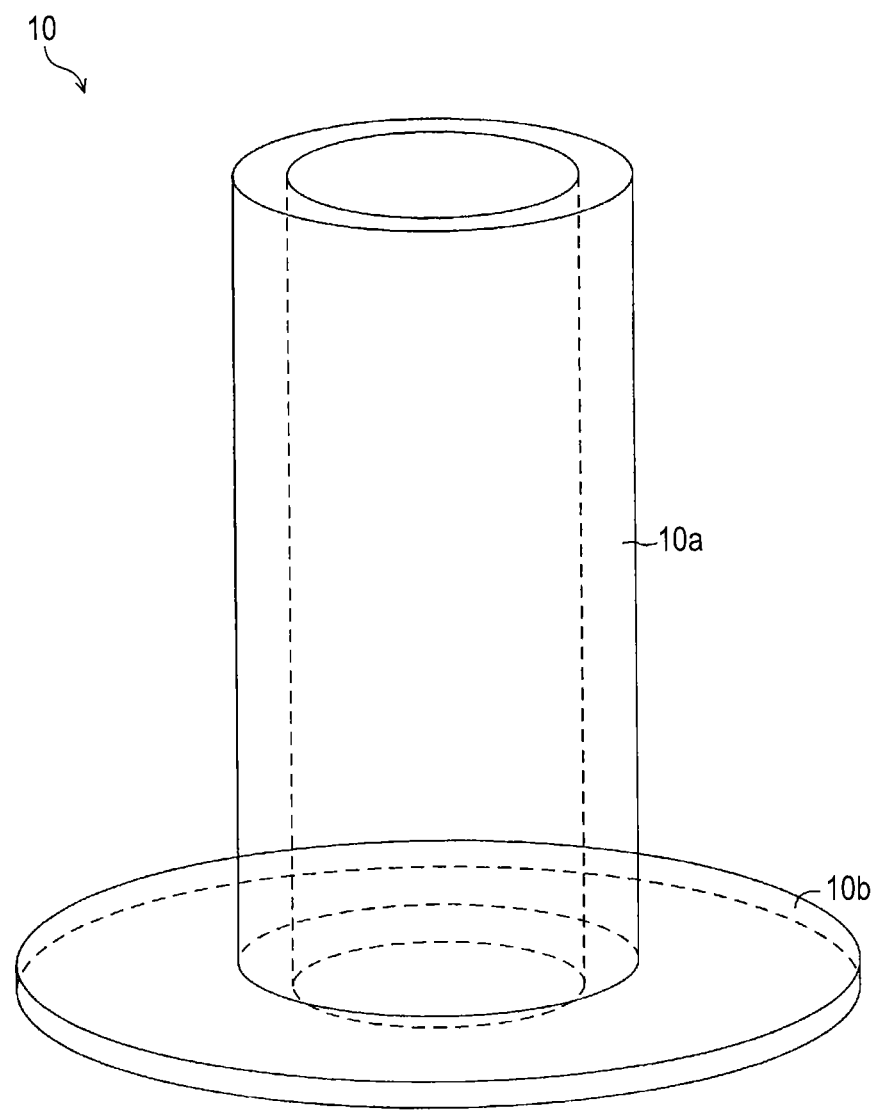
FIG. 6 is a perspective view of a cylindrical base material according to the second embodiment.

As shown in FIG. 5, the cylindrical base material 10 is loaded on the stage portion 62 of the cold head 6. FIG. 6 shows a perspective view of the cylindrical base material 10. As shown in FIG. 6, the cylindrical base material 10 has a hollow cylindrical portion 10a and a flange portion 10b (fixing portion) which is formed in a ring shape by extending in a radial shape from one end portion of the cylindrical portion 10a to radially outside. The cylindrical base material 10 is formed with a non-magnetic material having high thermal conductivity. The cylindrical base material 10 is, for example, formed with copper (Cu), aluminum (Al), or sapphire (alumina single crystal).

As shown in FIG. 5, the flange portion 10b is loaded on the stage portion 62 and the cylindrical portion 10a is extended to the upper side in FIG. 5 from the stage portion 62. The outer diameter of the cylindrical portion 10a is smaller than the inner diameter of the outer superconductor 2. The diameter of the flange portion 10b is substantially equivalent to the outer diameter of the outer superconductor 2. The outer superconductor 2 is loaded on the flange portion 10b. Accordingly, the flange portion 10b is interposed between one end surface of the outer superconductor 2 and the stage portion 62 of the cold head 6. In this state, the flange portion 10b is fixed to the cold head 6. At that time, the cylindrical portion 10a is disposed on the inner circumferential side of the outer superconductor 2 so that the inner circumferential surface of the outer superconductor 2 faces the outer circumferential side of the cylindrical portion 10a. The central axis of the outer superconductor 2 and the central axis of the cylindrical portion 10a coincide with each other. That is, the outer superconductor 2 and the cylindrical portion 10a are coaxially disposed.

The film-shaped (thin film-shaped or thick film-shaped) inner superconductor 3 is formed over the entire circumference of the outer circumferential surface of the cylindrical portion 10a of the cylindrical base material 10. Accordingly, the inner superconductor 3 exhibits a cylindrical shape according to the outer circumferential shape of the cylindrical portion 10a. The inner superconductor 3 is formed on the outer circumferential surface of the cylindrical portion 10a so that the thickness thereof is uniform.

A length of the cylindrical portion 10a in the axial direction is equivalent to a length of the outer superconductor 2 in the axial direction. The outer superconductor 2 which is loaded on the flange portion 10b of the cylindrical base material 10 and the inner superconductor 3 which is formed on the outer circumferential surface of the cylindrical portion 10a of the cylindrical base material 10 are held by the holder 4. At that time, the outer superconductor 2 and the inner superconductor 3 are coaxially disposed. In addition, one end surface of the outer superconductor 2 and the upper surface of the stage portion 62 of the cold head 6 are disposed to face each other with the flange portion 10b interposed therebetween.

The inner superconductor 3 is, for example, an RE—Ba—Cu—O based (RE is a rare earth containing Y) superconductor thin film or thick film which is formed by a vacuum film forming method or a liquid phase method, and is formed so that the c axis direction of the crystal structure coincides with a thickness direction (radial direction) and a layer is formed in the c axis direction. Accordingly, the critical current density $Jc\theta1$ of the supercurrent flowing in the circumferential direction of the inner superconductor 3 and the critical current density $Jcz1$ of the supercurrent flowing in the axial direction thereof are substantially equivalent ($Jc\theta1 \approx Jcz1$). Therefore, the critical current density Jc in the cylindrical circumferential surface has low anisotropy and high uniformity. That is, the ratio ($Jc\theta1/Jcz1$) is close to 1. In the same manner as in the first embodiment, the outer superconductor 2 is formed by a fusion method and is formed so that the c axis direction of the crystal structure coincides with the axial direction of the cylindrical outer superconductor 2 and the layer is formed in the c axis direction. Accordingly, the critical current density $Jcr2$ of a supercurrent flowing in the radial direction of the outer superconductor 2 and the critical current density $Jc\theta2$ of a supercurrent flowing in the circumferential direction thereof are large, but are smaller than the critical current density $Jcz2$ of a supercurrent flowing in the axial direction thereof. Therefore, the ratio ($Jc\theta2/Jcz2$) is significantly greater than 1. That is, also in the embodiment, the ratio ($Jc\theta1/Jcz1$) is closer to 1, than is the ratio ($Jc\theta2/Jcz2$).

Figure 7:
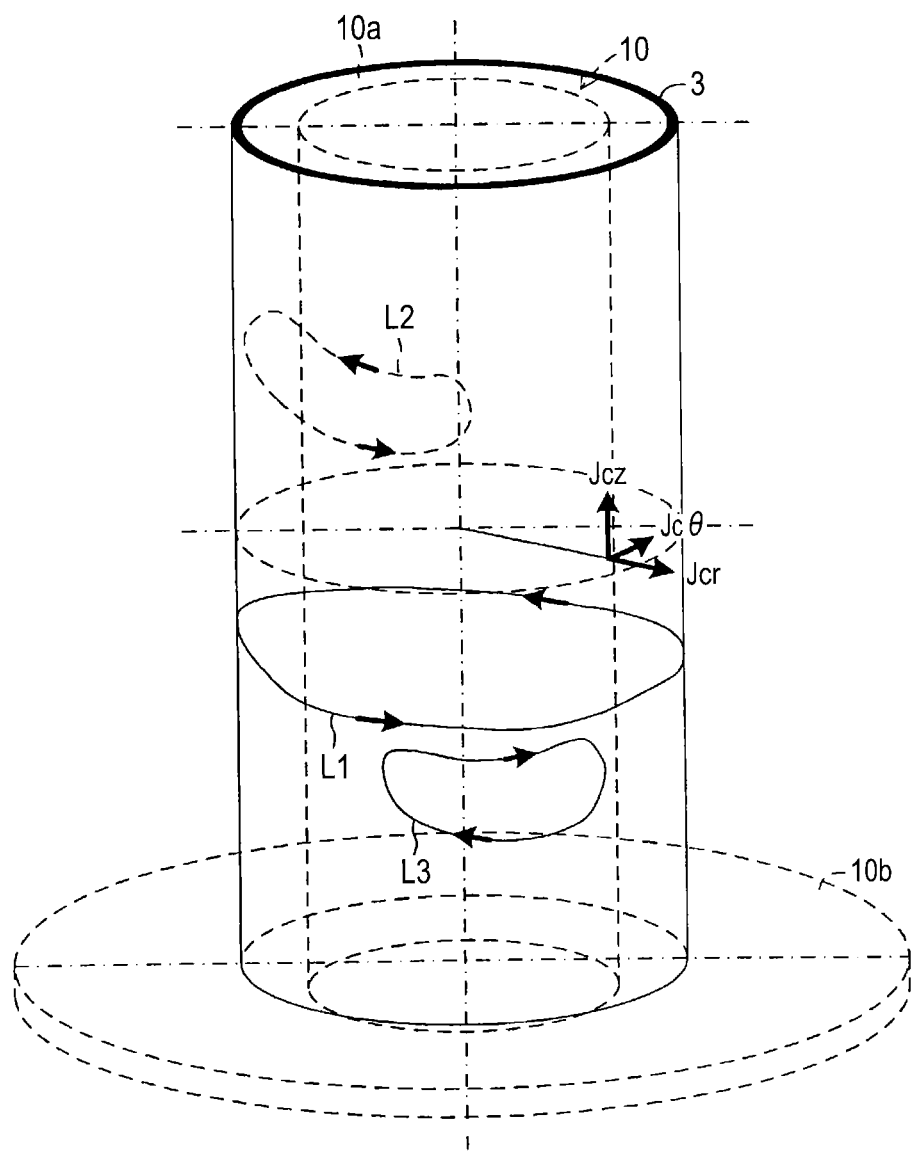
FIG. 7 is a diagram showing a correction current loop which is formed in an inner superconductor, when a trapped magnetic field is generated by the superconducting magnetic field generating device according to the second embodiment.

The basic operations of the superconducting magnetic field generating device 200 having the configurations described above are the same as the operations of the superconducting magnetic field generating device 100 according to the first embodiment, and therefore the specific description thereof will be omitted. FIG. 7 is a diagram showing the correction current loop which is formed in the inner superconductor 3, when the trapped magnetic field is generated by the superconducting magnetic field generating device 200. As shown in FIG. 7, the correction current loops L1, L2, and L3 are formed in the cylindrical circumferential surface of the cylindrical inner superconductor 3 which is formed on the outer circumferential surface of the cylindrical portion 10a of the cylindrical base material 10, according to the disorder in the supercurrent formed in the outer superconductor 2, that is, the non-uniformity of the trapped magnetic field formed by the supercurrent loop formed in the outer superconductor 2. By forming the correction current loops L1, L2, and L3, the non-uniformity characteristics of the trapped magnetic field are corrected, and as a result the uniformity of the trapped magnetic field is maintained. Therefore, it is possible to form the trapped magnetic field having an axisymmetric magnetic field strength distribution and uniform magnetic field strength in the central portion (room temperature bore space) in the bore of the superconductor 1.

In the embodiment, when cooling the superconductor 1, the outer superconductor 2 and the inner superconductor 3 are cooled through the same cylindrical base material 10. Accordingly, it is possible to cool the outer superconductor 2 and the inner superconductor 3 to substantially the same temperature. Since the inner superconductor 3 is formed on the outer circumferential surface of the cylindrical portion 10a of the cylindrical base material 10, the entire region of the inner superconductor 3 is uniformly cooled from the cylindrical portion 10a. Herein, the critical current density also changes depending on the temperature. Accordingly, when the temperature distribution on the cylindrical circumferential surface of the inner superconductor 3 is not uniform, the uniformity in the critical current density is deteriorated. From this viewpoint, in the embodiment, the entire region of the inner superconductor 3 is uniformly cooled by receiving cold heat from the cylindrical portion 10a of the cylindrical base material 10 as described above. Thus, it is possible to further increase the uniformity in the critical current density on the cylindrical circumferential surface of the inner superconductor 3.

The space in the container portion 91 (room temperature bore space) is a space which is not cooled from the spaces in the bore of the superconductor 1. According to the first embodiment, the radiant heat from the room temperature bore may be transmitted to the inner superconductor 3 and cooling efficiency of the inner superconductor 3 may be decreased. From this viewpoint, according to the embodiment, the cylindrical portion 10a of the cylindrical base material 10 is interposed between the inner superconductor 3 and the room temperature bore space. Accordingly, the cylindrical portion 10a shields the radiant heat from the room temperature bore space during the cooling of the inner superconductor 3. That is, it is possible to cool the inner superconductor 3 without receiving an effect of the radiant heat from the room temperature bore space. Therefore, the cooling efficiency of the inner superconductor 3 is improved.

Modification Example

In the superconducting magnetic field generating device 200 according to the second embodiment, the outer superconductor 2 is formed with the RE—Ba—Cu—O based superconducting bulk and the inner superconductor 3 is formed with a Bi—Sr—Ca—Cu—O based superconducting thin film. In this case, the superconducting transition temperature Tco of the outer superconductor 2 is 92 K and the superconducting transition temperature Tci of the inner superconductor 3 is approximately 110 K. That is, Tco is higher than Tci. Accordingly, in the cooling step, first, the state of the inner superconductor 3 becomes the superconducting state and then the state of the outer superconductor 2 becomes the superconducting state.

In the same manner as for general materials, the superconductor has magnetism based on the constituent elements and the crystal structure thereof and is magnetized when the superconductor is placed in a magnetic field. The magnitude of the magnetization changes depending on a change in a cooling temperature of the superconductor. Such a change in magnetization disorders the uniformity of the applied magnetic field. In the first and second embodiments, by adjusting the applied magnetic field when the superconductor 1 is cooled to the temperature before reaching superconducting Ts in the magnetic field adjustment step, the applied magnetic field having the increased non-uniformity due to the change in magnetization generated before that point is adjusted so as to have uniformity.

However, when Tco is higher than Tci, that is, when the state of the inner superconductor 3 reaches the superconducting state after the state of the outer superconductor 2, the magnitude of the magnetization of the outer superconductor 2 changes before the state of the inner superconductor 3 becomes the superconducting state, while the temperature of the outer superconductor 2 decreases from Tco to Tci (strictly, while the temperature decreases from Ts to Tci). The applied magnetic field adjusted to have uniformity is disordered due to the change in the magnitude of the magnetization. Accordingly, the inner superconductor 3 reaching a superconducting state after that traps the disordered magnetic field, that is, non-uniform magnetic field.

With respect to this, in the modification example, the material compositions are determined so that the superconducting transition temperature Tci of the inner superconductor 3 is higher than the superconducting transition temperature Tco of the outer superconductor 2. That is, Tci is set to be higher than Tco according to the difference in the material compositions. When Tci is higher than Tco, that is, when the state of the inner superconductor 3 reaches the superconducting state before the state of the outer superconductor 2, the disorder in the applied magnetic field due to the change in the magnetization of the outer superconductor 2 after the state of the inner superconductor 3 reaches the superconducting state is cancelled out with the supercurrent flowing to the inner superconductor 3. Accordingly, the effect to the applied magnetic field due to the change in the magnetization of the outer superconductor 2 generated while the temperature of the outer superconductor 2 decreases from Tci to Tco is cancelled out.

Therefore, a more uniform magnetic field is trapped.

Third Embodiment

Figure 8:
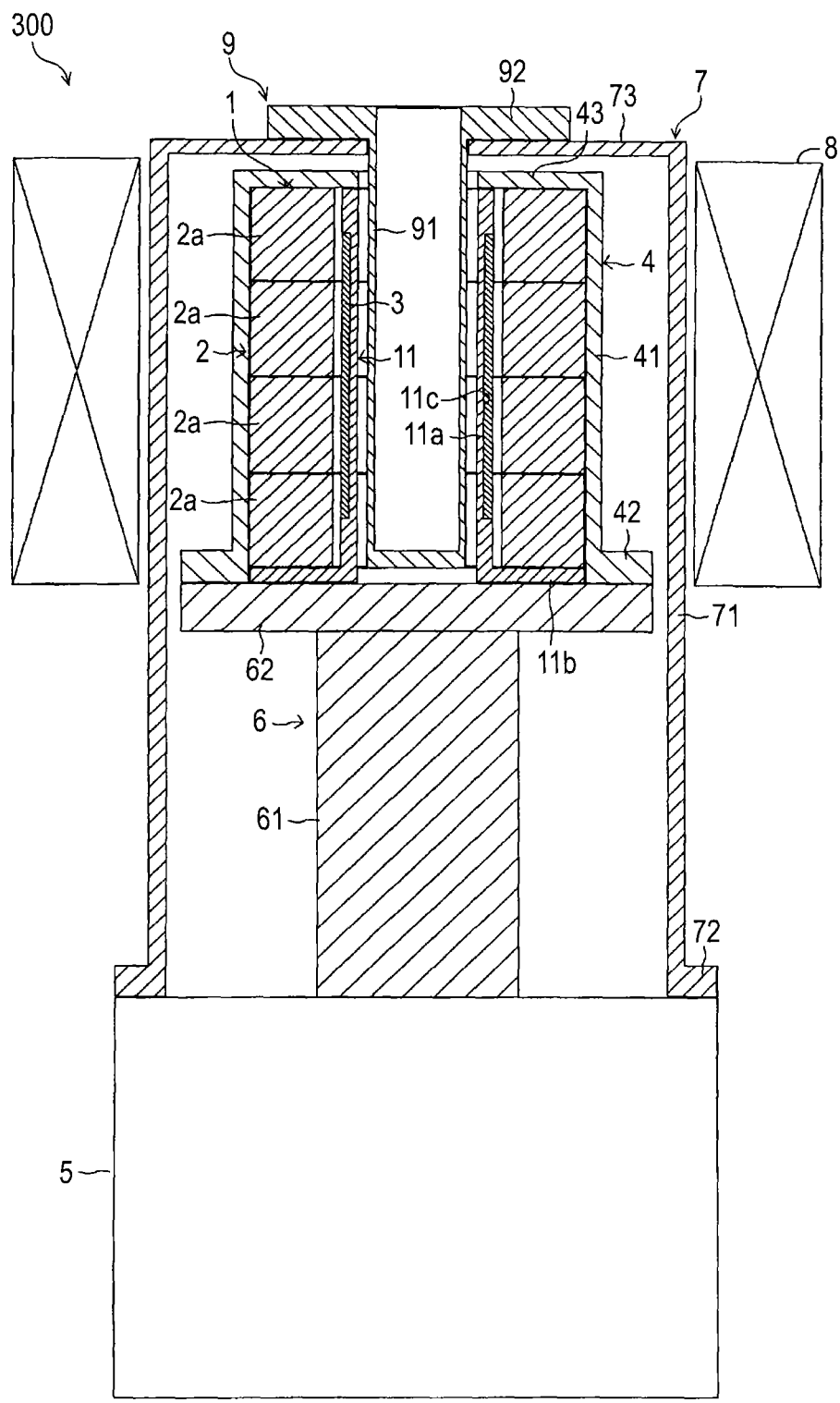
FIG. 8 is a schematic view showing a cross section of a superconducting magnetic field generating device according to a third embodiment which is taken along a plane including a central line in the vertical direction.

Next, a third embodiment will be described. FIG. 8 is a schematic view showing a cross section of a superconducting magnetic field generating device 300 according to the third embodiment which is taken along a plane including a central line in the vertical direction. The superconducting magnetic field generating device 300 is basically the same as the superconducting magnetic field generating device 200 according to the second embodiment, except for a slight change in the shape of the cylindrical base material shown in the second embodiment and adhesion fixation of the inner superconductor 3 to a cylindrical base material. Therefore, the same reference numerals are used for the same components as the components of the superconducting magnetic field generating device 200 shown in FIG. 5 described in the second embodiment and the description thereof will be omitted.

Figure 9:
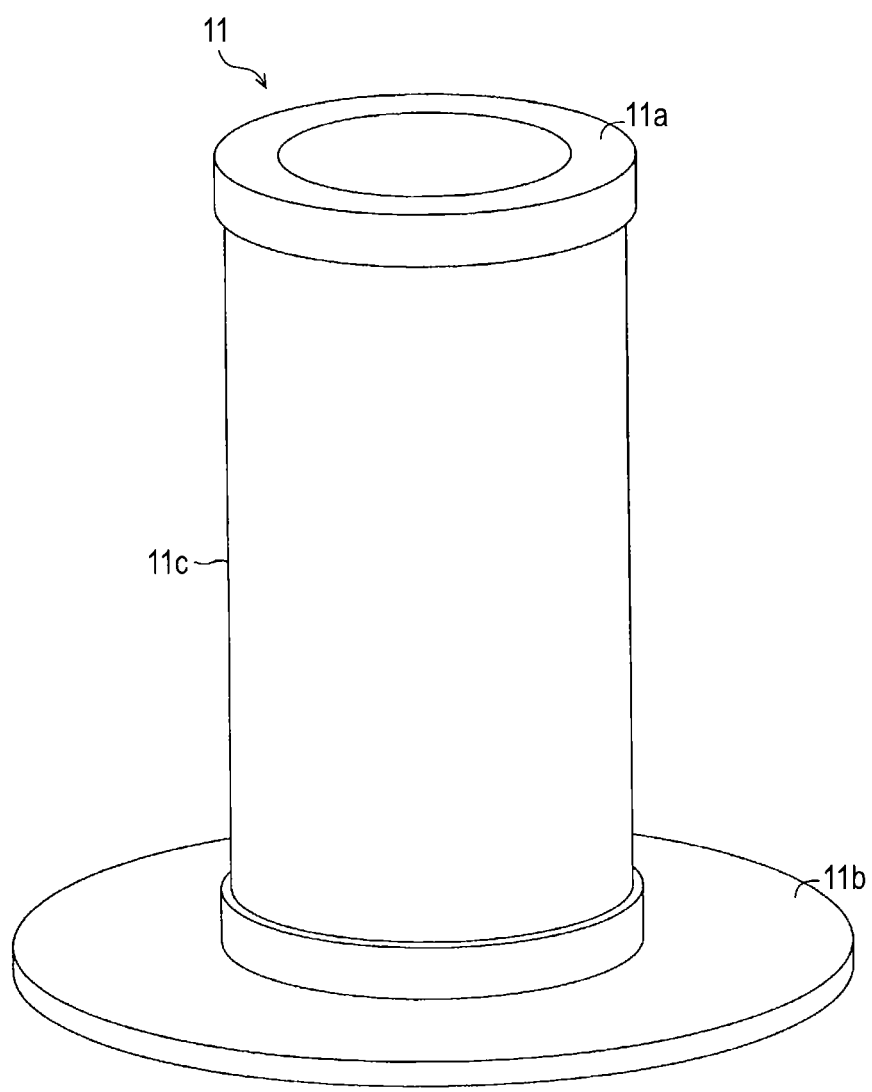
FIG. 9 is a perspective view of a cylindrical base material according to the third embodiment.

FIG. 9 is a perspective view of a cylindrical base material 11 used in the superconducting magnetic field generating device 300 according to the embodiment. As shown in FIG. 9, the cylindrical base material 11 includes a cylindrical portion 11a and a flange portion 11b, in the same manner as in the cylindrical base material 10 described in the second embodiment. The cylindrical portion 11a is formed in a stepped cylindrical shape formed to have an outer diameter in the central portion in the axial direction to be smaller than an outer diameter in both end portions. The inner superconductor 3 is adhered and fixed to a central portion 11c having a small outer diameter.

In general, since the inner superconductor 3 of the embodiment is an element which is called a superconducting tape wire rod or a superconducting thin strip, the inner superconductor is formed on a surface of a metal strip of such as Hastelloy by a vacuum film forming method or a liquid phase method. In the embodiment, such a superconducting thin strip is formed as a wide film having a constant thickness and is wound on the outer circumferential surface of the central portion 11c of the cylindrical portion 11a in the circumferential direction. At that time, the inner superconductor 3 is wound more than once round in the circumferential direction, so that a winding start end portion of the film-shaped inner superconductor (superconducting thin strip) 3 in a winding direction (circumferential direction) is covered with the inner superconductor 3 wound thereon. In the embodiment and fourth and fifth embodiments described later, the superconducting thin strip is used as the inner superconductor 3.

Figure 10A:
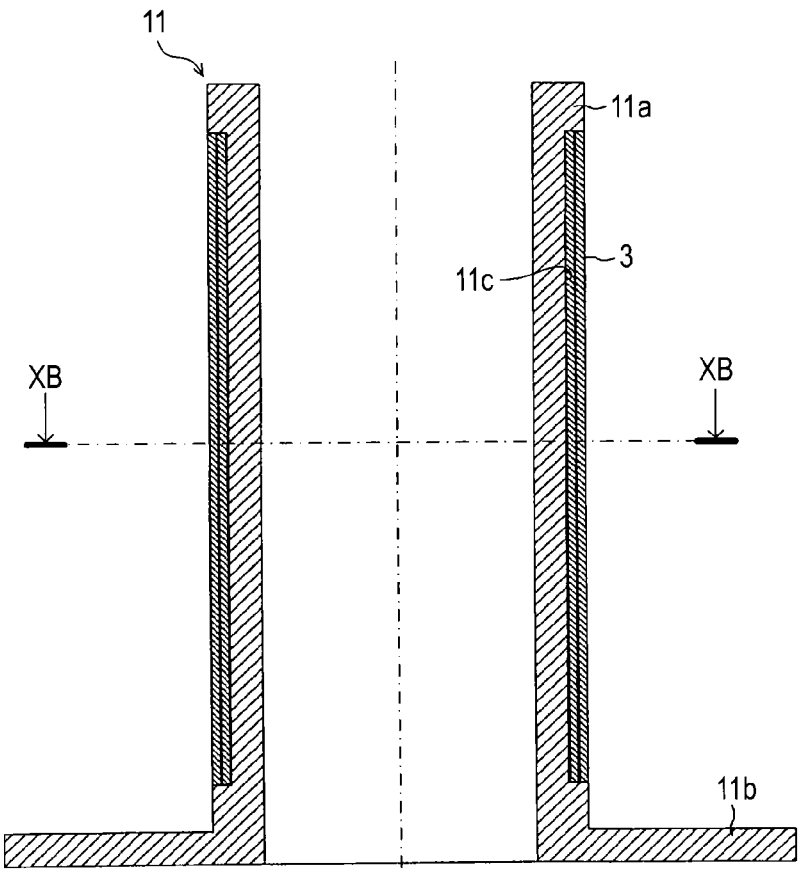
FIGS. 10A and 10B show the cylindrical base material around which an inner superconductor according to the third embodiment is wound.
Figure 10B:
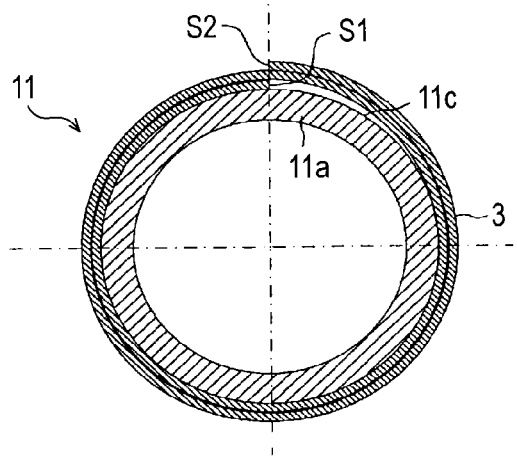

FIGS. 10A and 10B show the cylindrical base material 11 around which the inner superconductor 3 is wound, in which FIG. 10A is a cross-sectional view of the cylindrical base material 11 around which the inner superconductor 3 is wound, which is taken along a plane passing through the central axis of the cylindrical portion 11a of the cylindrical base material 11 and FIG. 10B is a cross-sectional view taken XB-XB in FIG. 10A. As shown in FIG. 10B, in the embodiment, the film-shaped inner superconductor 3 is wound around the outer circumferential surface of the central portion 11c of the cylindrical portion 11a so as to be wound twice around in the circumferential direction of the cylindrical portion 11a. Accordingly, a winding start end portion S1 of the inner superconductor 3 is covered with the inner superconductor 3 which is wound thereon. In addition, a winding ending portion S2 of the inner superconductor 3 is positioned on a portion under which the inner superconductor is already wound. By doing so, the inner superconductor 3 wound on the cylindrical portion 11a exhibits a cylindrical shape. The wound inner superconductor 3 is adhered and fixed to the cylindrical portion 11a with an impregnant or an adhesive having high thermal conductivity.

Figure 11:
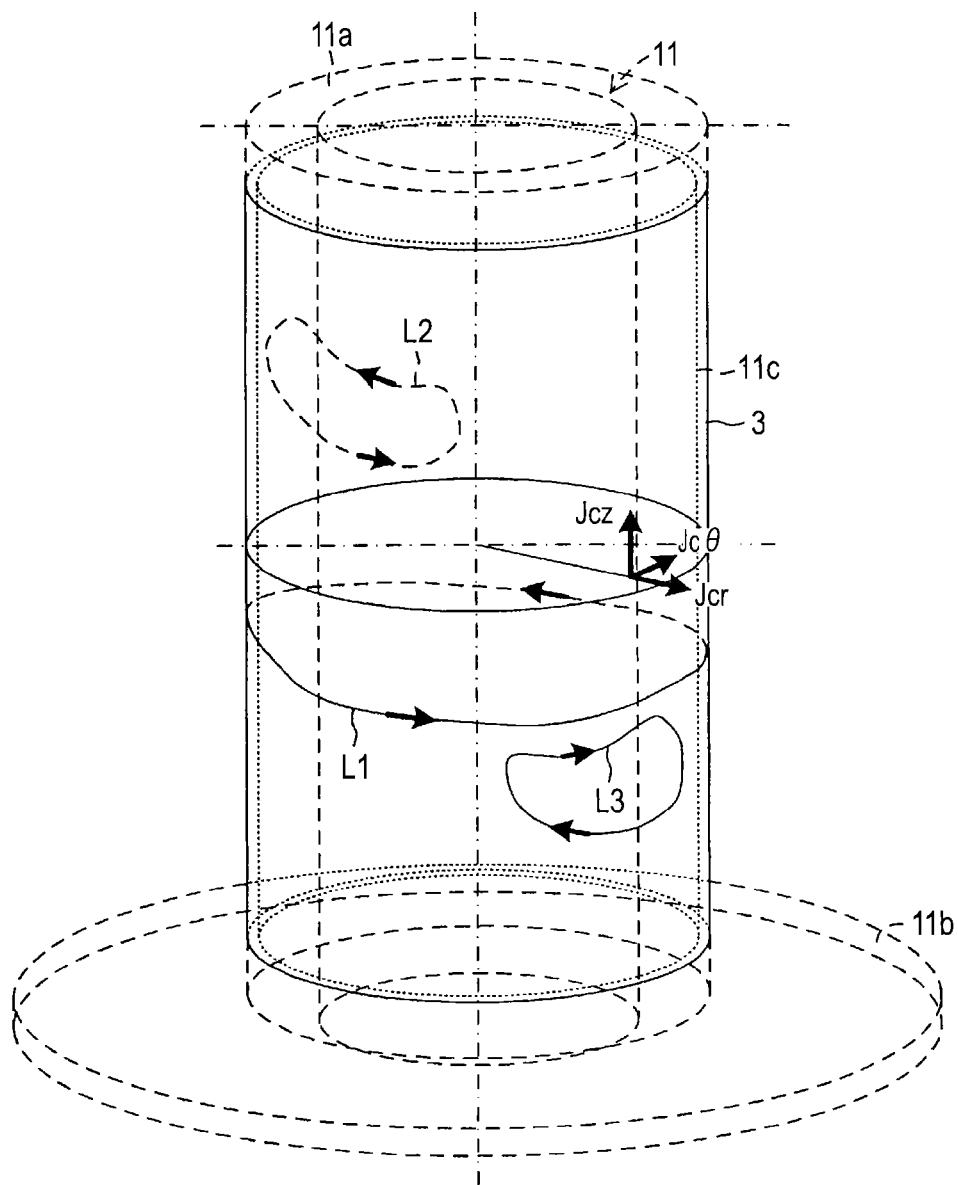
FIG. 11 is a diagram showing a correction current loop which is formed in an inner superconductor, when a trapped magnetic field is generated by the superconducting magnetic field generating device according to the third embodiment.

The basic operations of the superconducting magnetic field generating device 300 according to the embodiment having the configurations described above are the same as the operations of the superconducting magnetic field generating device 100 according to the first embodiment, and therefore the specific description thereof will be omitted. FIG. 11 is a diagram showing the correction current loop which is formed in the inner superconductor 3, when the trapped magnetic field is generated by the superconducting magnetic field generating device 300. As shown in FIG. 11, the correction current loops L1, L2, and L3 are formed in the cylindrical inner superconductor 3 wound on the outer circumferential surface of the central portion 11c of the cylindrical portion 11a of the cylindrical base material 11, according to the disorder in the supercurrent loop formed in the outer superconductor 2. By forming the correction current loops L1, L2, and L3, the uniformity of the trapped magnetic field is maintained.

In the embodiment, it is possible to form the inner superconductor 3 on the outer circumferential surface of the cylindrical base material 11 by performing a simple step of winding the inner superconductor (superconducting thin strip) 3 as one wide film on the cylindrical portion 11a of the cylindrical base material 11. Since the inner superconductor 3 is wound on the cylindrical portion 11a more than once round, in the circumferential direction, the end portion S1 positioned at the winding starting position of the inner superconductor 3 is covered with a portion to be overlaid thereon. Accordingly, the supercurrent loop passing the end portion S1 positioned at the winding starting position is formed on a portion to be overlaid thereon. The end portion S2 positioned in the winding ending position of the inner superconductor 3 is positioned on the portion under which the inner superconductor is already wound. Accordingly, the supercurrent loop passing the end portion S2 positioned at the winding ending position is formed on a portion under which the inner superconductor is wound. As described above, since the inner superconductor 3 is configured so as to form even a supercurrent loop which is formed so as to pass through the end portions (winding starting end portion S1 and winding ending end portion S2) of the inner superconductor 3, it is possible to form the supercurrent loop having an arbitrary shape in an arbitrary position in the inner superconductor 3. In the embodiments and fourth, fifth, and sixth embodiments which will be described later, the inner superconductor 3 is disposed on the central portion 11c having a small outer diameter from the cylindrical portion 11a of the cylindrical base material 11, but the effects described above are not limited to this disposition. As shown in FIG. 8 of the third embodiment, the inner superconductor 3 may be disposed over the entire length of the cylindrical portion 11a in the axial direction and may be configured so that the length thereof in the axial direction is the same length as the length of the outer superconductor 2 in the axial direction. In addition, the length of the inner superconductor 3 in the axial direction may be greater than the length of the outer superconductor 2 in the axial direction.

Fourth Embodiment

Figure 12A:
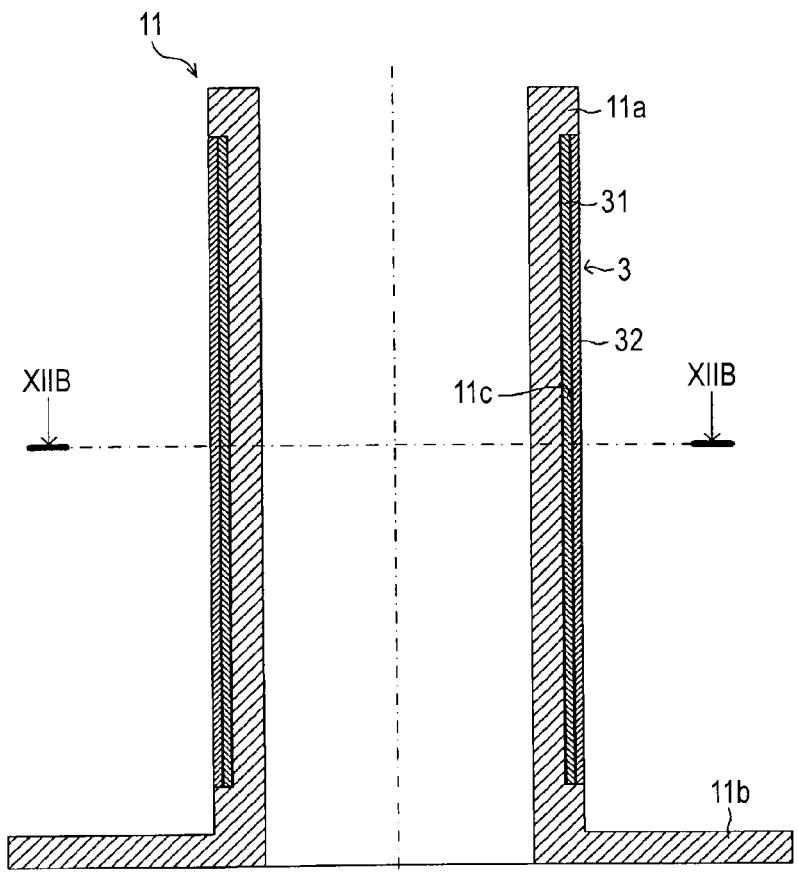
FIGS. 12A and 12B are diagrams showing a cylindrical base material around which an inner superconductor configured with a plurality of film-shaped superconductors according to a fourth embodiment is wound.
Figure 12B:
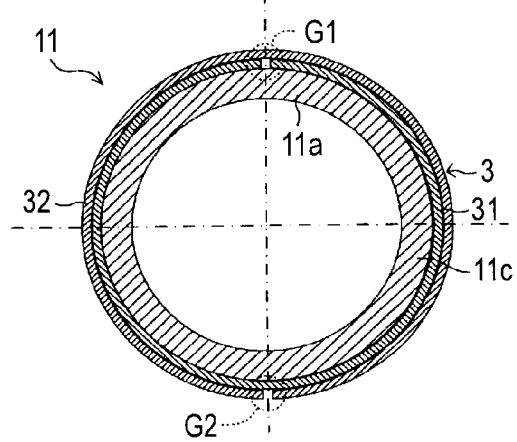

In the third embodiment, the film-shaped inner superconductor (superconducting thin strip) 3 is wound on the outer circumferential surface of the central portion 11c of the cylindrical portion 11a of the cylindrical base material 11 more than once round in the circumferential direction, as an example, but it is possible to configure the inner superconductor 3 with a plurality of film-shaped superconductors (superconducting thin strips) wound just once round or less than once round in the circumferential direction. FIGS. 12A and 12B are diagrams showing the cylindrical base material 11 around which an inner superconductor configured with a plurality of film-shaped superconductors is wound, in which FIG. 12A is a cross-sectional view of the cylindrical base material 11 around which an inner superconductor 3 according to the embodiment is wound, which is taken along a plane passing through the central axis of the cylindrical portion 11a and FIG. 12B is a cross-sectional view taken XIIB-XIIB in FIG. 12A.

As shown in FIGS. 12A and 12B, the inner superconductor 3 includes a first film-shaped inner superconducting layer (superconducting thin strip) 31 and a second film-shaped inner superconducting layer (superconducting thin strip) 32. As clearly shown in FIG. 12B, the first inner superconducting layer 31 is wound on the outer circumferential surface of the central portion 11c of the cylindrical portion 11a of the cylindrical base material 11 along the circumferential direction. A length of the first inner superconducting layer 31 in a winding direction (circumferential direction) is the same as or slightly smaller than the length of the central portion 11c of the cylindrical portion 11a in the circumferential direction. Accordingly, an end portion and the other end portion of the first inner superconducting layer 31 in the winding direction come in contact with each other at a position G1. The second inner superconducting layer 32 is wound along the circumferential direction of the first inner superconducting layer 31 which is wound on the central portion 11c of the cylindrical portion 11a. A length of the second inner superconducting layer 32 in the winding direction (circumferential direction) is substantially equivalent to the length of the second inner superconducting layer 32 in the circumferential direction. Accordingly, an end portion and the other end portion of the second inner superconducting layer 32 come in contact with each other at a position G2. Herein, the respective inner superconducting layers 31 and 32 are wound so that the position G1 and the position G2 are formed at different positions of the cylindrical portion 11a in the circumferential direction, specifically, so that the position G1 and the position G2 do not overlap in the circumferential direction of the cylindrical portion 11a. That is, both end portions of the first inner superconducting layer 31 in the circumferential direction and a region therebetween (position G1) and both end portions of the second inner superconducting layer 32 in the circumferential direction and a region therebetween (position G2) are disposed at different positions in the circumferential direction.

Figure 13:
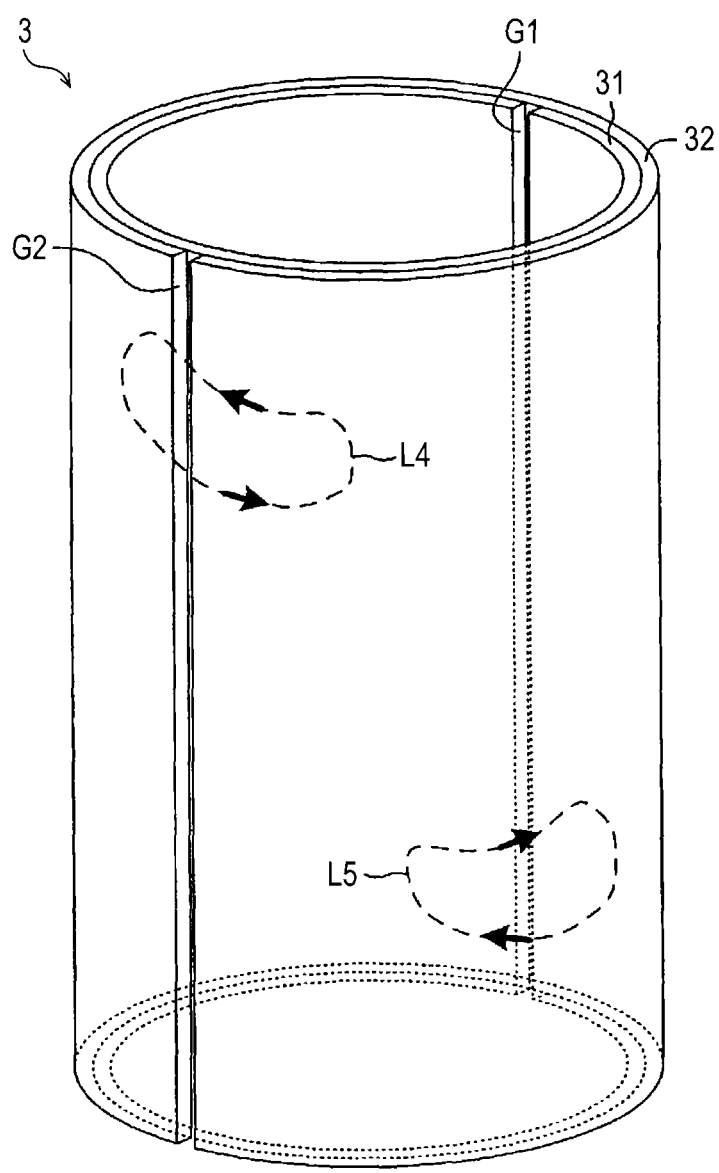
FIG. 13 is a diagram showing a correction current loop which is formed in an inner superconductor according to the fourth embodiment.

FIG. 13 is a diagram showing a correction current loop which is formed in the inner superconductor 3 wound on the cylindrical portion 11a as described above. In FIG. 13, a correction current loop L4 is formed at a position passing the position G2 in which both end portions of the second inner superconducting layer 32 in the circumferential direction come in contact with each other. The correction current loop L4 in such a position is hard to form on the second inner superconducting layer 32, but can be formed on the first inner superconducting layer 31. This is because a systematically discontinuous part, where both end portions do not come in contact with each other, is not formed on a portion of the first inner superconducting layer 31 where the correction current loop L4 is to be formed. A correction current loop L5 in FIG. 13 is formed in a position passing the position G1 where both end portions of the first inner superconducting layer 31 in the circumferential direction come in contact with each other. The correction current loop L5 in such a position is hard to form on the first inner superconducting layer 31, but can be formed on the second inner superconducting layer 32. This is because a systematically discontinuous part, where both end portions do not come in contact with each other, is not formed on a portion of the second inner superconducting layer 32 where the correction current loop L5 is to be formed.

As described above, the correction current loop to be formed in a region, which is hard to form in the first inner superconducting layer 31, is formed in the second inner superconducting layer 32, and the correction current loop to be formed in a region, which is hard to form in the second inner superconducting layer 32, is formed in the first inner superconducting layer 31. As described above, since the correction current loops are formed so that the first inner superconducting layer 31 and the second inner superconducting layer 32 complement each other, it is possible to form the supercurrent loop having an arbitrary shape in an arbitrary position in the inner superconductor 3.

Fifth Embodiment

In the third embodiment and the fourth embodiment, the inner superconductor 3 is configured with wide film-shaped superconductors (superconducting thin strips), but it is difficult to manufacture the wide film-shaped superconductors. Therefore, an example of forming the inner superconductor 3 with a superconducting thin strip having a narrow width (superconducting tape wire rod) will be described.

Figure 14:
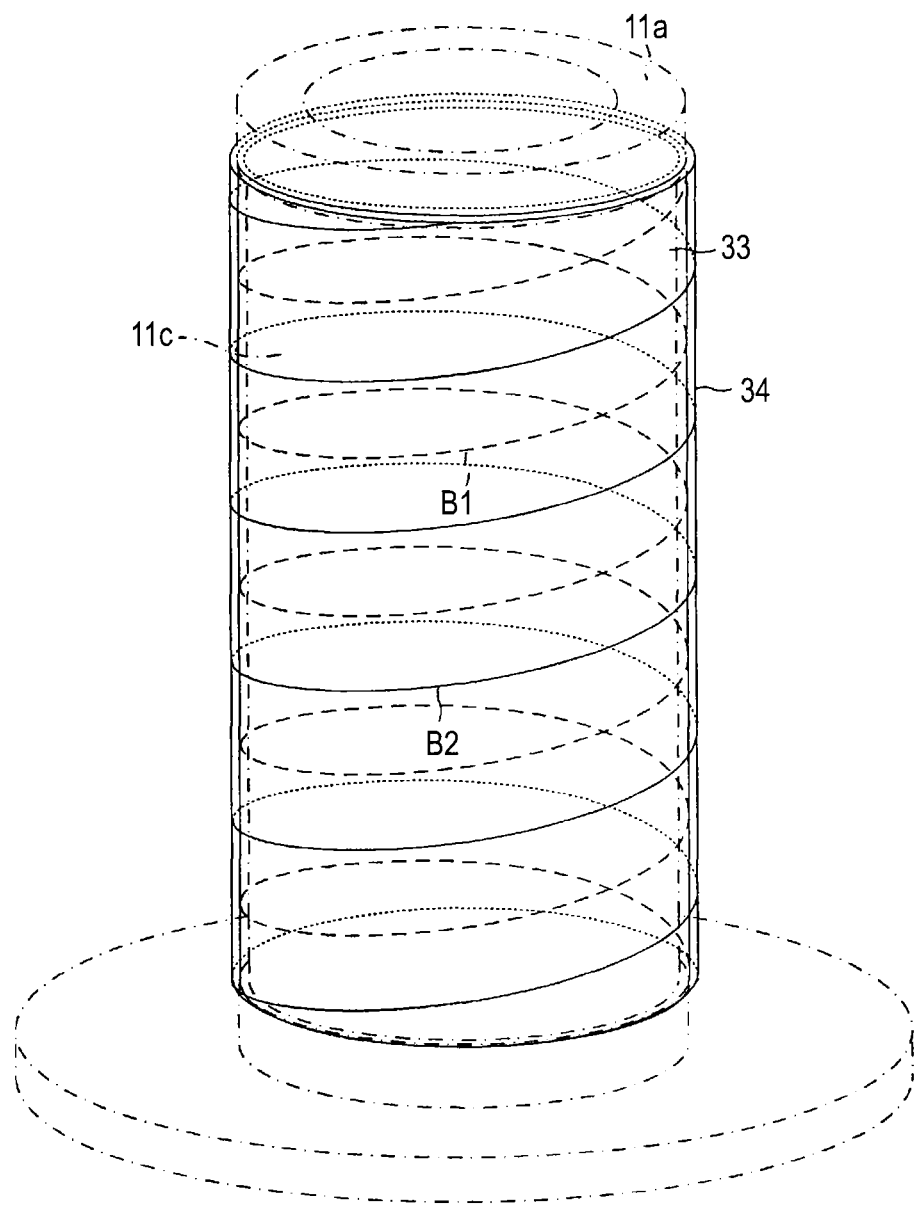
FIG. 14 is a diagram showing a state where an inner superconductor according to a fifth embodiment is wound around a cylindrical base material.

FIG. 14 is a diagram showing a state where the inner superconductor 3 according to the embodiment is wound around the cylindrical base material 11. The inner superconductor 3 is configured with a first inner superconducting thin strip 33 and a second inner superconducting thin strip 34. Both of the width of the first inner superconducting thin strip 33 and the width of the second inner superconducting thin strip 34 are smaller than the width (length in the axial direction) of the central portion 11c of the cylindrical portion 11a of the cylindrical base material 11. The greater widths of the first inner superconducting thin strip 33 and the second inner superconducting thin strip 34 are better.

The first inner superconducting thin strip 33 is wound on the outer circumferential surface of the central portion 11c of the cylindrical portion 11a of the cylindrical base material 11. In this case, the first inner superconducting thin strip 33 is wound on the outer circumferential surface of the central portion 11c in a spiral shape so that a parallel advancing direction is the axial direction of the cylindrical portion 11a. In addition, the second inner superconducting thin strip 34 is wound on the outer circumferential surface of the first inner superconducting thin strip 33 which is wound on the outer circumferential surface of the central portion 11c of the cylindrical portion 11a of the cylindrical base material 11 in a spiral shape. In this case, the second inner superconducting thin strip 34 is wound on the first inner superconducting thin strip 33 in a spiral shape so that a parallel advancing direction is the axial direction of the cylindrical portion 11a. Both end portions of the first inner superconducting thin strip 33 and the second inner superconducting thin strip 34 which are wound in a spiral shape in the circumferential direction are obliquely cut along the end portion of the central portion 11c of the cylindrical base material 11 in the axial direction.

Figures 15A, 15B:
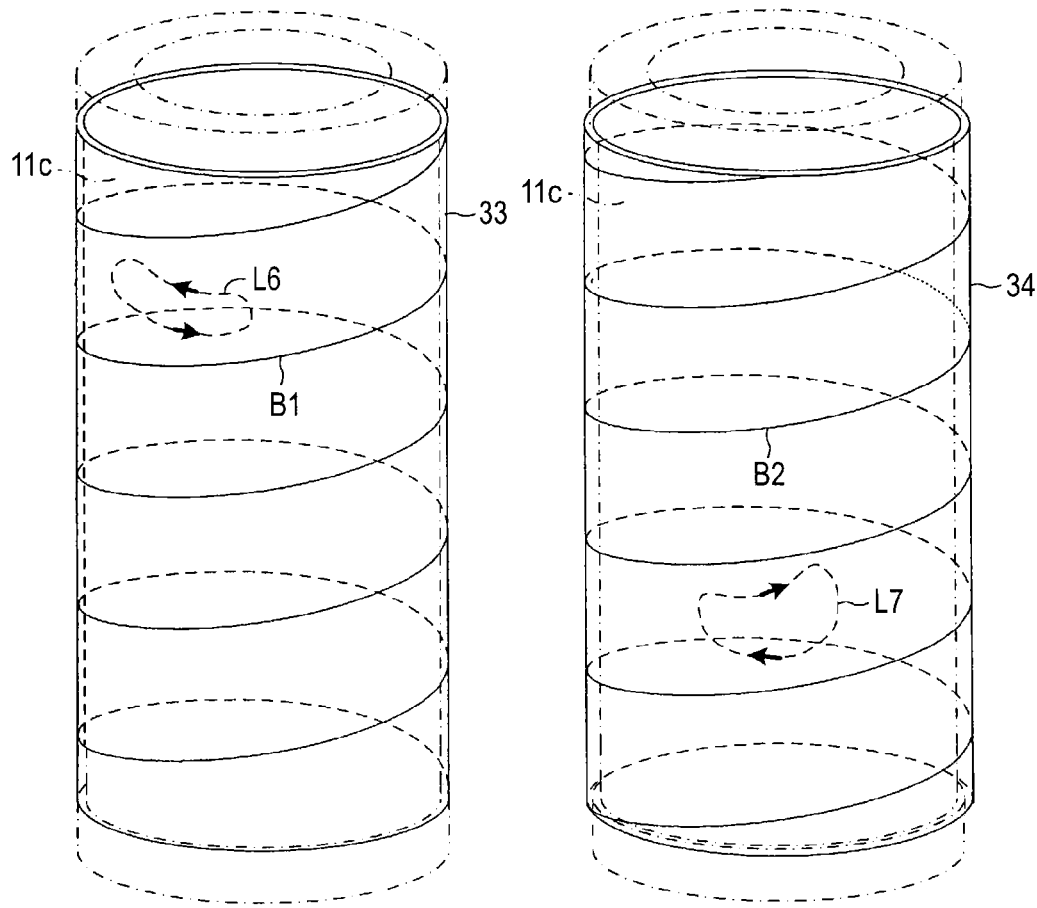
FIGS. 15A and 15B are diagrams separately showing a first superconducting thin strip and a second superconducting thin strip in a wound state.

FIGS. 15A and 15B are diagrams separately showing the first inner superconducting thin strip 33 and the second inner superconducting thin strip 34 in the wound state, in which FIG. 15A shows the first inner superconducting thin strip 33 and FIG. 15B shows the second inner superconducting thin strip 34. As shown in FIG. 15A, the first inner superconducting thin strip 33 is wound in a spiral shape and side edges adjacent to each other in the axial direction come in contact with each other without a gap. Accordingly, a boundary line B1 between a side edge and an adjacent side edge is formed in a spiral shape. In addition, as shown in FIG. 15B, the second inner superconducting thin strip 34 is also wound in a spiral shape and side edges adjacent to each other in the axial direction come in contact with each other without a gap therebetween. Accordingly, a boundary line B2 between a side edge and an adjacent side edge is formed in a spiral shape.

As understood by comparing FIG. 15A and FIG. 15B, the boundary line B1 and the boundary line B2 are deviated from each other in the axial direction of the cylindrical portion 11a, so that the formation position of the spiral boundary line B1 formed on the first inner superconducting thin strip 33 (that is, position of the side edge of the first inner superconducting thin strip 33) and the formation position of the spiral boundary line B2 formed on the second inner superconducting thin strip 34 (that is, position of the side edge of the second inner superconducting thin strip 34) do not coincide with each other. Therefore, a correction current loop L6 passing the boundary line B2 formed with the side edges of the second inner superconducting thin strip 34 is formed in the first inner superconducting thin strip 33 and a correction current loop L7 passing the boundary line B1 formed with the side edges of the first inner superconducting thin strip 33 is formed in the second inner superconducting thin strip 34.

As described above, by configuring the inner superconductor 3 by winding a plurality of superconducting thin strips having a small width in a spiral shape so that the positions of side edges are formed in different positions, the correction current loop to be formed in a position passing one side edge is formed in the other superconducting thin strip. That is, the induced correction current loop is definitely formed in any superconducting thin strip. Accordingly, it is possible to form the supercurrent loop having an arbitrary shape in an arbitrary position in the inner superconductor 3.

Sixth Embodiment

Figure 16:
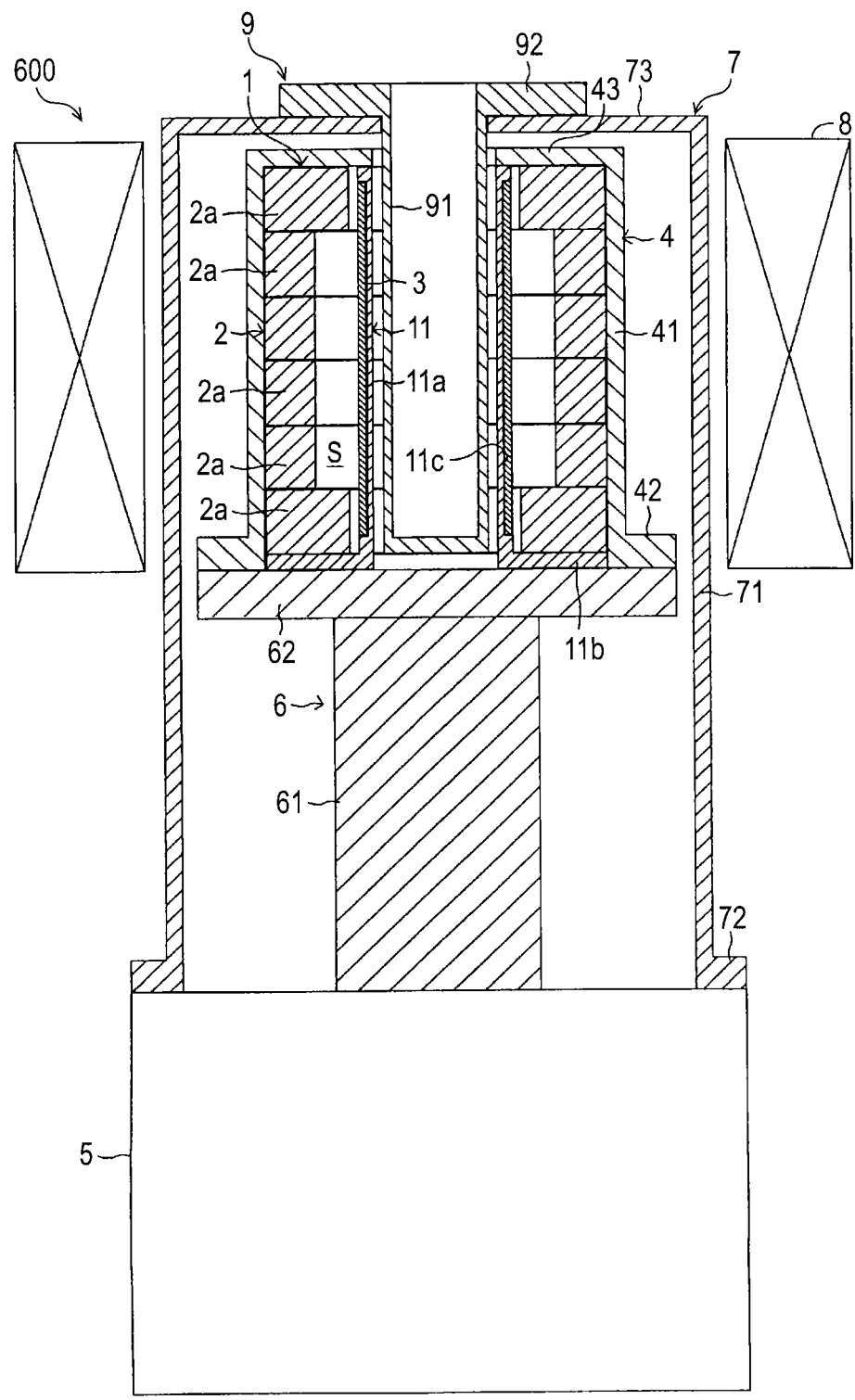
FIG. 16 is a schematic view showing a cross section of a superconducting magnetic field generating device according to a sixth embodiment which is taken along a plane including a central line in the vertical direction.

Next, a sixth embodiment will be described. FIG. 16 is a schematic view showing a cross section of a superconducting magnetic field generating device 600 according to the sixth embodiment which is taken along a plane including a central line in the vertical direction. The superconducting magnetic field generating device 600 is basically the same as the superconducting magnetic field generating device 300 according to the third embodiment, except for the structure of the outer superconductor 2 and the inner superconductor 3. Therefore, the same reference numerals are used for the same components as the components of the superconducting magnetic field generating device 300 of FIG. 8 described in the third embodiment and the description thereof will be omitted.

The outer superconductor 2 included in the superconducting magnetic field generating device 600 according to the embodiment is configured by stacking six ring-shaped superconducting bulks 2a. Among the six superconducting bulks 2a, the inner diameter of the superconducting bulk disposed on the uppermost side and the superconducting bulk disposed on the lowermost side in FIG. 16 is smaller than the inner diameter of the four superconducting bulks disposed therebetween. Accordingly, the outer superconductor 2 is formed in a cylindrical shape having a great inner diameter of the central portion in the axial direction and a small inner diameter of both end portions. Therefore, an expanded space S is formed on the middle portion of the outer superconductor 2 on the inner circumferential side in the axial direction, specifically, between the superconducting bulks configuring both end sides of the outer superconductor 2.

The first inner superconducting thin strip 33 and the second inner superconducting thin strip 34 of the fifth embodiment were used as the inner superconductor 3. As described in the fifth embodiment, the superconducting thin strips are wound on the central portion 11c of the cylindrical portion 11a of the cylindrical base material 11 in a spiral shape. The superconducting thin strips are wound on the outer circumferential surface of the central portion 11c of the cylindrical portion 11a in a spiral shape so that the side edges are deviated in the axial direction of the cylindrical portion 11a of the cylindrical base material 11, that is, so that the positions of the side edges of the respective superconducting thin strips do not coincide with each other. By doing so, the inner superconductor 3 configured by winding two superconducting thin strips on the cylindrical portion 11a in a spiral shape has a cylindrical shape. The inner superconductor 3 is disposed on the inner circumferential side of the outer superconductor 2 coaxially with the outer superconductor 2.

The superconducting bulks configuring the outer superconductor 2 are Eu—Ba—Cu—O based superconductors and are formed by a fusion method. The superconducting transition temperature of the outer superconductor 2 is approximately 92 K. The inner superconductor 3 is a Gd—Ba—Cu—O based superconducting thin strip and is formed by a vacuum film forming method. The superconducting transition temperature of the inner superconductor 3 is also approximately 92 K. In the embodiment, the outer superconductor 2 is also formed so that the c axis direction of the crystal structure of the outer superconductor 2 coincides with the axial direction of the outer superconductor 2 and a layer is formed in the c axis direction. The inner superconductor 3 is formed so that the c axis direction of the crystal structure of the inner superconductor 3 coincides with the radial direction of the inner superconductor 3 and a layer is formed in the c axis direction. Accordingly, the ratio ($Jc\theta1/Jcz1$) of the critical current density $Jc\theta1$ in the circumferential direction to the critical current density $Jcz1$ of the inner superconductor 3 in the axial direction is closer to 1 than the ratio ($Jc\theta2/Jcz2$) of the critical current density $Jc\theta2$ in the circumferential direction to the critical current density $Jcz2$ of the outer superconductor 2 in the axial direction.

In the superconducting magnetic field generating device 600 having the configurations described above, first, the pressure of the enclosed space accommodating the outer superconductor 2 and the inner superconductor 3 was reduced and then the external magnetic field generating coil 8 was operated to generate the applied magnetic field. At that time, the magnetic field was applied so that the magnetic flux passes along the axial direction of the cylindrical superconductor 1. The outer superconductor 2 and the inner superconductor 3 were cooled by operating the cooling device 5, while the magnetic field is applied by the external magnetic field generating coil 8. When the outer superconductor 2 and the inner superconductor 3 were cooled to a temperature (temperature before reaching superconducting Ts) which is slightly higher than either of the superconducting transition temperatures (in this example, 92 K because both the superconducting transition temperature of the outer superconductor 2 and superconducting transition temperature of and the inner superconductor 3 are approximately 92 K) (for example, when the outer superconductor and the inner superconductor were cooled to 100 K), the magnetic field generating coil 8 was controlled so that the magnetic field, which had a magnetic field strength of 4.7 T and was uniform in the axial direction and the radial direction, was formed in the bore of the superconductor 1 (magnetic field adjustment step). In a state where the magnetic field having strength of 4.7 T was maintained, the outer superconductor 2 and the inner superconductor 3 were cooled and temperature thereof was decreased to 50 K.

Herein, the superconducting transition temperature of the outer superconductor 2 and the superconducting transition temperature of the inner superconductor 3 are substantially the same (approximately 92 K), in a case of a zero magnetic field (when the magnetic field is not applied). However, the superconducting transition temperature is decreased in the magnetic field having a strength of 4.7 T. A degree of the decrease of the superconducting transition temperature depends on the c axis direction of the crystal structure. That is, when the c axis direction is a passage direction of the magnetic flux of the applied magnetic field, a ratio of decrease of the superconducting transition temperature is great, but when the c axis direction is a passage direction of the magnetic flux of the applied magnetic field, a ratio of decrease of the superconducting transition temperature is small. In the embodiment, the c axis direction of the crystal structure of the outer superconductor 2 is the passage direction of the magnetic flux of the applied magnetic field and the c axis direction of the crystal structure of the inner superconductor 3 is a direction orthogonal to the passage direction of the magnetic flux of the applied magnetic field. Accordingly, the ratio of decrease of the superconducting transition temperature of the outer superconductor 2 due to the applied magnetic field is great and the ratio of decrease of the superconducting transition temperature of the inner superconductor 3 is small. Therefore, in a state where the magnetic field having a strength of 4.7 T is applied, the superconducting transition temperature Tco of the outer superconductor 2 is lower than the superconducting transition temperature Tci of the inner superconductor 3. That is, in the embodiment, the superconducting transition temperature Tci of the inner superconductor 3 in the applied magnetic field is higher than the superconducting transition temperature Tco of the outer superconductor, due to the difference of the c axis direction, not the difference of the material composition. As a result, the state of the inner superconductor 3 first becomes a superconducting state and then the state of the outer superconductor 2 becomes a superconducting state.

The applied magnetic field is removed, while the temperature of the outer superconductor 2 and the temperature of the inner superconductor 3 are maintained at 50 K. Accordingly, the supercurrent is induced to the outer superconductor 2 and the applied magnetic field is trapped. Therefore, the trapped magnetic field is formed. The correction current flows to the inner superconductor 3. The uniformity of the trapped magnetic field is maintained by this correction current. Therefore, the uniform trapped magnetic field is formed in the bore of the superconductor 1.

Figure 17:
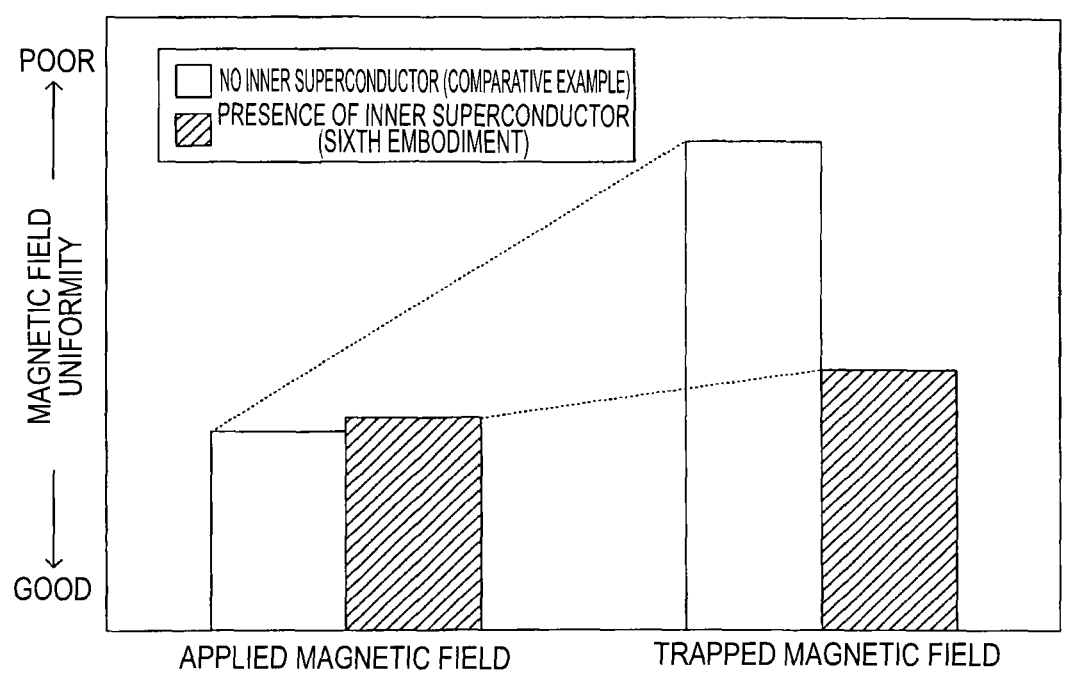
FIG. 17 is a graph showing uniformity of a trapped magnetic field generated in the superconducting magnetic field generating device according to the sixth embodiment and uniformity of a trapped magnetic field generated in a superconducting magnetic field generating device according to a comparative example with respect to uniformity of the applied magnetic field.

Verification of Improvement Effect of Magnetic Field Uniformity by Inner Superconductor In order to verify the improvement of the uniformity of the trapped magnetic field by causing the correction current to flow to the inner superconductor 3, the magnetic field was trapped by the outer superconductor 2 under the same conditions as described above, using the superconducting magnetic field generating device according to a comparative example which is the superconducting magnetic field generating device 600 according to the sixth embodiment excluding the inner superconductor 3. The uniformity of the trapped magnetic field which is formed in the room temperature bore space of the superconducting magnetic field generating device 600 according to the sixth embodiment and the uniformity of the trapped magnetic field which is formed in the room temperature bore space of the superconducting magnetic field generating device according to the comparative example were investigated. FIG. 17 is a graph showing the uniformity of the trapped magnetic field which is formed in the room temperature bore space of the superconducting magnetic field generating device 600 according to the sixth embodiment and the uniformity of the trapped magnetic field which is formed in the room temperature bore space of the superconducting magnetic field generating device according to the comparative example, with respect to the uniformity of the applied magnetic field. The magnetic field uniformity on a vertical axis of the graph can be represented by a difference between the magnetic field strength in the central position of the room temperature bore space and the magnetic field strength in a position of the room temperature bore space separate from the central position by a predetermined distance, for example.

As shown in FIG. 17, the uniformity of the applied magnetic field is substantially the same in the case using the superconducting magnetic field generating device 600 according to the sixth embodiment and the case using the superconducting magnetic field generating device according to the comparative example. However, the uniformity of the trapped magnetic field obtained in the case using the superconducting magnetic field generating device according to the comparative example is extremely poor compared to the uniformity of the applied magnetic field. With respect to this, the uniformity of the trapped magnetic field obtained in the case using the superconducting magnetic field generating device 600 according to the sixth embodiment is not much different from the uniformity of the applied magnetic field. Accordingly, it was verified that the uniform trapped magnetic field can be formed by causing the correction current loop to flow to the inner superconductor 3.

However, the outer superconductor 2 may generate the non-uniform magnetic field by receiving the effect of the applied magnetic field during cooling and being magnetized. The magnetic field generated as described above changes depending on the cooling temperature. Accordingly, when the superconducting transition temperature Tci of the inner superconductor 3 is lower than the superconducting transition temperature Tco of the outer superconductor 2, the applied magnetic field is disordered due to the change of the non-uniform magnetic field generated from the outer superconductor 2, while the cooling temperature decreases from the temperature Tco to the temperature Tci. The applied magnetic field which is disordered and not uniform as described above is then trapped by the inner superconductor 3 which is cooled to the temperature Tci or lower and reaches the superconducting state. When the disordered non-uniform magnetic field is trapped by the inner superconductor 3, it is difficult to sufficiently maintain the uniformity of the trapped magnetic field. With respect to this, in the embodiment, as described above, the superconducting transition temperature Tci of the inner superconductor 3 in the applied magnetic field having a strength of 4.7 T is higher than the superconducting transition temperature Tco of the outer superconductor 2 due to the difference of the c axis direction, and thus, the state of the inner superconductor 3 first becomes the superconducting state. Therefore, the disorder in the applied magnetic field caused by the change in the magnitude of the magnetization of the outer superconductor 2 occurred while the temperature is decreased from the temperature Tci to the temperature Tco is offset by causing the supercurrent to flow to the inner superconductor 3 which is already in the superconducting state. Thus, the non-uniformity of the trapped magnetic field caused by the change in the magnitude of the magnetization of the outer superconductor 2 is also corrected by the inner superconductor 3. As a result, it is possible to further increase the uniformity of the trapped magnetic field.

In the embodiment, the space S expanded in the central portion of the outer superconductor 2 in the axial direction is formed. Accordingly, the non-uniformity of the trapped magnetic field generated by the magnetization of the outer superconductor 2 is offset by formation of the magnetic field between the superconducting bulk disposed on one end side and the superconducting bulk disposed on the other end side in the axial direction, among the superconducting bulks configuring the outer superconductor 2. Therefore, it is possible to further increase the uniformity of the trapped magnetic field.

Seventh Embodiment

Next, a seventh embodiment will be described. A superconducting magnetic field generating device 700 according to the embodiment has the same configuration as the configuration of the superconducting magnetic field generating device described in the sixth embodiment, except that a cylindrical base material 12 is held by the outer superconductor 2 and the space (room temperature bore space) in the container portion 91 of the cylindrical container 9 is widened. Therefore, the same reference numerals are used for the same components as the components of the superconducting magnetic field generating device 600 of FIG. 16 described in the sixth embodiment and the description thereof will be omitted.

Figure 18:
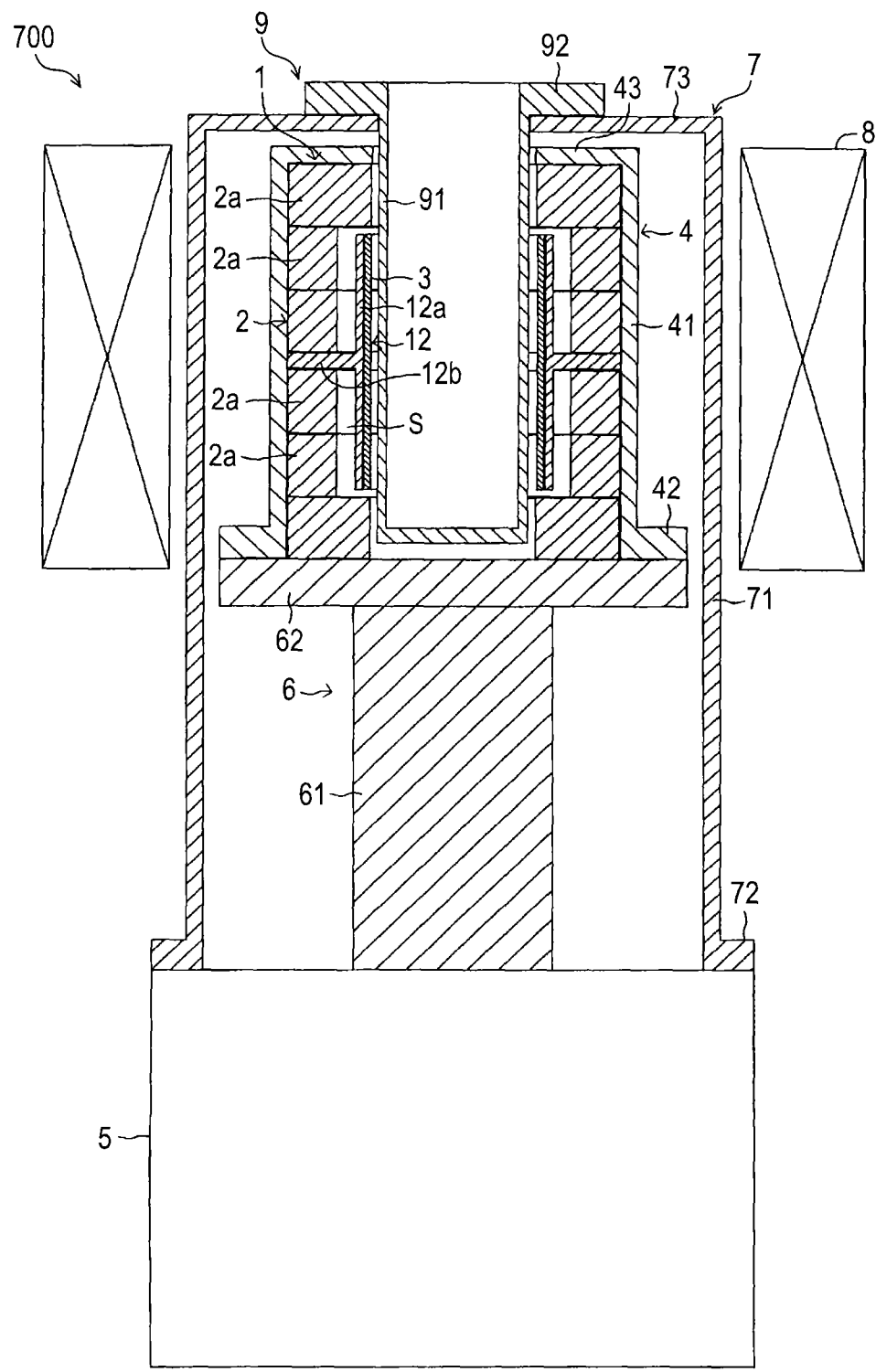
FIG. 18 is a schematic view showing a cross section of a superconducting magnetic field generating device according to a seventh embodiment which is taken along a plane including a central line in the vertical direction.
Figure 19:
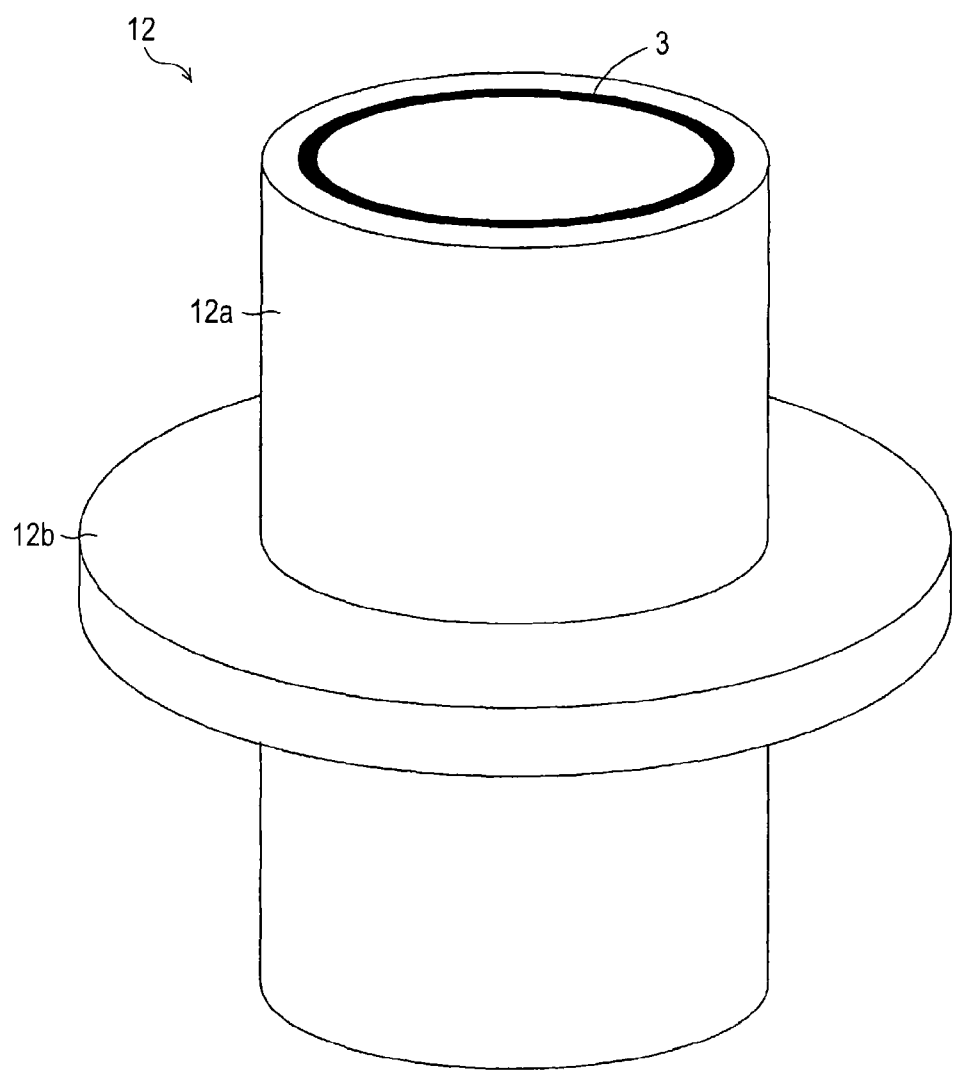
FIG. 19 is a schematic perspective view of a cylindrical base material according to the seventh embodiment.

FIG. 18 is a schematic view showing a cross section of the superconducting magnetic field generating device 700 according to the seventh embodiment which is taken along a plane including a central line in the vertical direction. As shown in FIG. 18, the superconducting magnetic field generating device 700 includes the cylindrical base material 12. FIG. 19 shows a schematic perspective view of the cylindrical base material 12. As shown in FIG. 19, the cylindrical base material 12 includes a cylindrical portion 12a formed in a cylindrical shape, and a connection portion 12b which is formed in a ring shape by being extended in a radial shape from the central portion of the outer circumferential surface of the cylindrical portion 12a in the axial direction to radially outside of the cylindrical portion 12a.

The outer superconductor 2 is configured in a cylindrical shape by stacking six ring-shaped superconducting bulks 2a in the axial direction. Among the six ring-shaped superconducting bulks configuring the outer superconductor 2, the connection portion 12b of the cylindrical base material 12 is interposed between the three upper half superconducting bulks and three lower half superconducting bulks. Since the fixing portion 42 of the holder 4 is fixed to the stage portion 62 of the cold head 6, the outer superconductor 2 formed of the six superconducting bulks and the connection portion 12b are fixed to the cold head 6. By doing so, the cylindrical base material 12 is held by the inner superconductor 3.

Among the six ring-shaped superconducting bulks 2a configuring the outer superconductor 2, the inner diameter of the superconducting bulk which is disposed on the lowermost side and the superconducting bulk which is disposed on the uppermost side is smaller than the inner diameter of the superconducting bulks which are disposed therebetween. Accordingly, in the same manner as in the sixth embodiment, the expanded space S is formed between the superconducting bulk which is disposed on the uppermost side and the superconducting bulk which is disposed on the lowermost side of the outer superconductor 2. The cylindrical portion 12a of the cylindrical base material 12 is disposed in the expanded space S.

The inner superconductor 3 is formed on the inner circumferential wall of the cylindrical portion 12a of the cylindrical base material 12. Accordingly, the inner superconductor 3 is formed in a cylindrical shape. The inner superconductor 3 is formed over the entire surface on the inner circumferential wall of the cylindrical portion 12a by a vacuum film forming method, for example. At that time, the outer superconductor 2 and the inner superconductor 3 are coaxially disposed. The other configurations are the same as the configurations shown in the sixth embodiment, and therefore the description thereof will be omitted. Since the operation of the superconducting magnetic field generating device 700 according to the embodiment is also the same as the operation of the superconducting magnetic field generating device 600 described in the sixth embodiment, the description thereof will be omitted.

According to the superconducting magnetic field generating device 700 according to the embodiment, the cylindrical portion 12a of the cylindrical base material 12 and the inner superconductor 3 formed on the inner circumferential wall of the cylindrical portion 12a are disposed in the expanded space S which is formed between the superconducting bulk on one end side and the superconducting bulk on the other end side of the outer superconductor 2 in the axial direction. Accordingly, it is possible to increase the diameter of the bore of the superconductor 1 and the diameter of the room temperature bore space (that is, diameter of the container portion 91 of the cylindrical container 9), in comparison to the case where the cylindrical base material and the inner superconductor 3 are disposed on the inner circumferential side of the outer superconductor 2.

Eighth Embodiment

Figure 20:
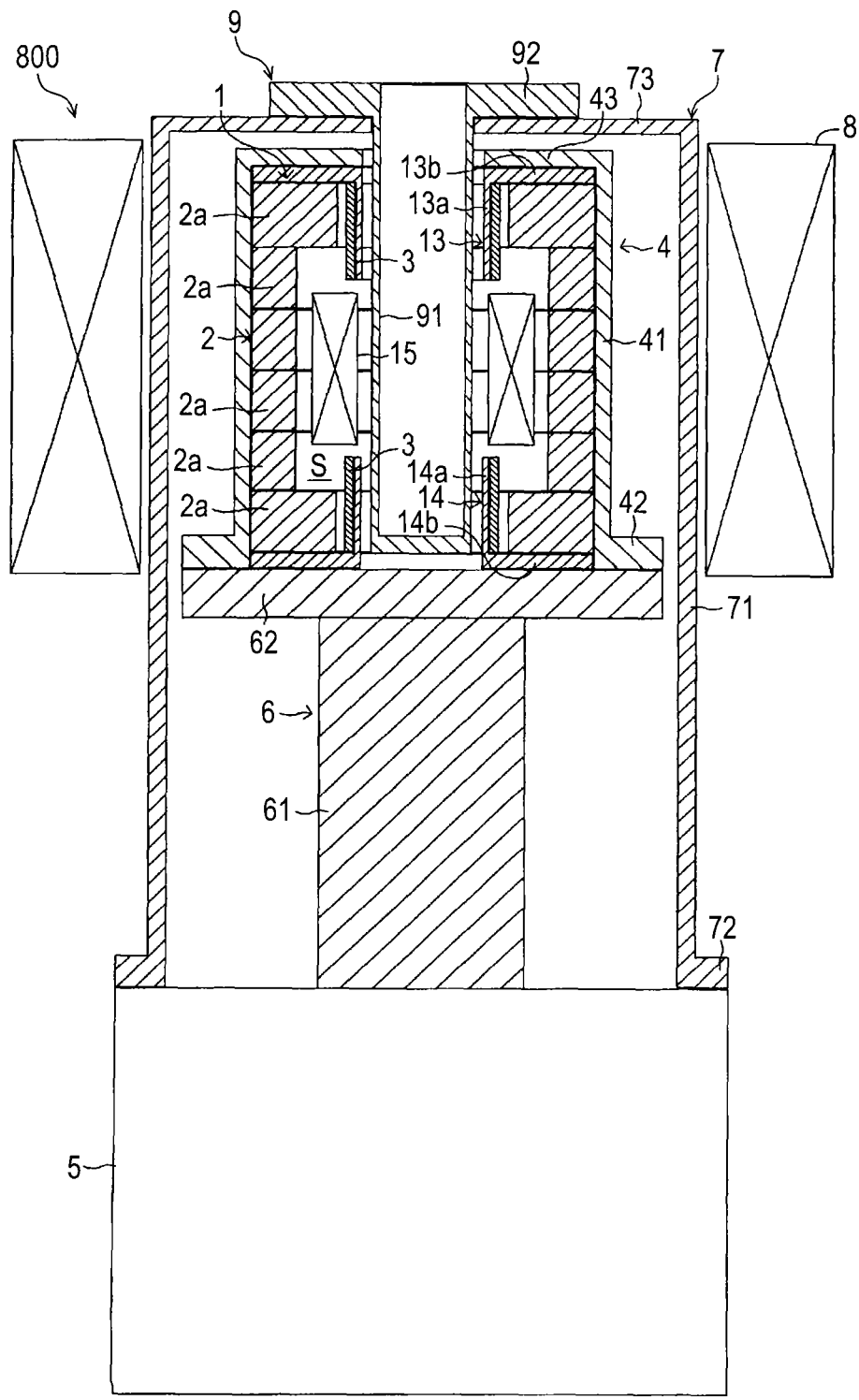
FIG. 20 is a schematic view showing a cross section of a superconducting magnetic field generating device according to an eighth embodiment which is taken along a plane including a central line in the vertical direction.
Figure 21:
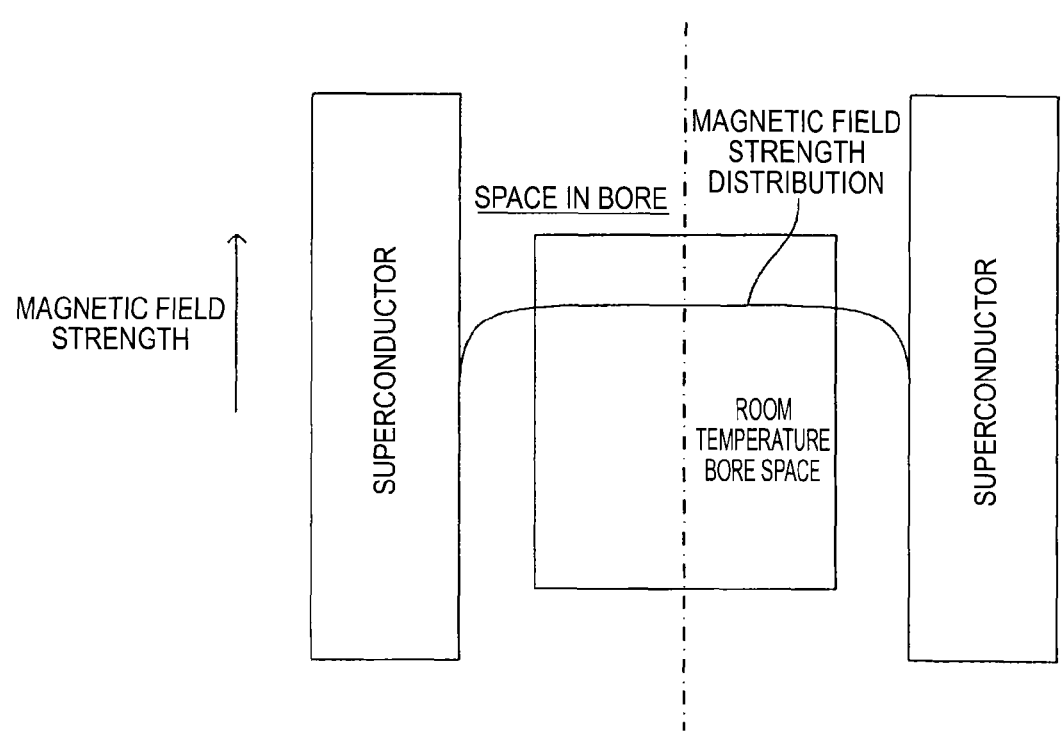
FIG. 21 is a diagram showing a trapped magnetic field which is formed in a bore of a superconductor, has an axisymmetric magnetic field strength distribution, and has uniform magnetic field strength in a central portion.

Next, an eighth embodiment will be described. FIG. 20 is a schematic view showing a cross section of a superconducting magnetic field generating device 800 according to the eighth embodiment which is taken along a plane including a central line in the vertical direction. As shown in FIG. 20, in the same manner as in the sixth embodiment, the outer superconductor 2 included in the superconducting magnetic field generating device 800 is formed in a cylindrical shape by stacking six ring-shaped superconducting bulks 2a. The expanded space S is formed between the superconducting bulks on both ends configuring the outer superconductor 2. A shim coil 15 is disposed in the expanded space S. The shim coil 15 generates the magnetic field by being electrically connected to the outside. The trapped magnetic field is corrected so as to have a uniform magnetic field strength distribution equal to or lower than 1 ppm, for example, by the magnetic field generated from the shim coil 15.

In the embodiment, the cylindrical base material is divided into an upper cylindrical base material 13 and a lower cylindrical base material 14. The upper cylindrical base material 13 includes a cylindrical portion 13a and a fixing portion 13b which is formed in a ring shape by extending in a radial shape from one end portion of the cylindrical portion 13a to radially outside, and is fixed to the holder 4 in a state where the fixing portion 13b is interposed between the upper end of the outer superconductor 2 and the end surface portion 43 of the holder 4. The lower cylindrical base material 14 includes a cylindrical portion 14a and a fixing portion 14b which is formed in a ring shape by extending in a radial shape from one end portion of the cylindrical portion 14a to radially outside, and is fixed to the stage portion 62 in a state where the fixing portion 14b is interposed between the lower end of the outer superconductor 2 and the stage portion 62 of the cold head 6.

The length of the cylindrical portion 13a of the upper cylindrical base material 13 in the axial direction is greater than the length of the uppermost superconducting bulk in the axial direction among the superconducting bulks 2a configuring the outer superconductor 2. The length of the cylindrical portion 14a of the lower cylindrical base material 14 in the axial direction is greater than the length of the lowermost superconducting bulk in the axial direction among the superconducting bulks 2a configuring the outer superconductor 2. The inner superconductor 3 is formed respectively on the outer circumferential surface of the cylindrical portion 13a of the upper cylindrical base material 13 and the outer circumferential surface of the cylindrical portion 14a of the lower cylindrical base material 14. The shim coil 15 is disposed between the distal end (lower end) of the cylindrical portion 13a of the upper cylindrical base material 13 and the distal end (upper end) of the cylindrical portion 14a of the lower cylindrical base material 14. Accordingly, the inner superconductor 3, the shim coil 15, and the inner superconductor 3 are disposed in this order from the upper portion of the inner circumferential side of the outer superconductor 2 in the axial direction. The inner superconductor 3 respectively formed in the cylindrical portions 13a and 14a is in a cylindrical shape and is coaxially disposed with the outer superconductor 2.

Since the other configurations are the same as the configurations described in the sixth embodiment, the same reference numerals are used for the same components as the components of the superconducting magnetic field generating device 600 shown in FIG. 16 described in the sixth embodiment and the description thereof will be omitted. Since the operation of the superconducting magnetic field generating device 800 according to the embodiment is also the same as the operation of the superconducting magnetic field generating device 600 described in the sixth embodiment, the description thereof will be omitted.

According to the embodiment, the expanded space S is formed in the central portion of the outer superconductor 2 in the axial direction. Since the cylindrical base materials 13 and 14 are formed by being vertically divided in FIG. 20, the cylindrical base material and the inner superconductor formed on the cylindrical base material are not disposed in the central portion of the outer superconductor 2 in the axial direction. Accordingly, a wide space is formed in the central portion of the outer superconductor 2 in the axial direction and the shim coil 15 can be disposed in the wide space. Therefore, the shim coil 15 may not be disposed in the room temperature bore space (in the container portion 91 of the cylindrical container 9). As a result, it is possible to widen the room temperature bore space.

An aspect of this disclosure provides a superconducting magnetic field generating device including: a superconductor which includes an outer superconductor which is formed of a high temperature superconducting material in a cylindrical shape and generates a trapped magnetic field by trapping an applied magnetic field in a state of being cooled to a temperature equal to or lower than a superconducting transition temperature, and an inner superconductor which is formed with a high temperature superconducting material in a cylindrical shape and is coaxially disposed with the outer superconductor on the inner circumferential side of the outer superconductor, and a cooling device which cools the outer superconductor and the inner superconductor to a temperature equal to or lower than the superconducting transition temperature, in which the inner superconductor is formed so that a ratio ($Jc\theta1/Jcz1$) of a critical current density ($Jc\theta1$) in the circumferential direction to a critical current density ($Jcz1$) of the inner superconductor in the axial direction is closer to 1 than a ratio ($Jc\theta2/Jcz2$) of the critical current density ($Jc\theta2$) in the circumferential direction to a critical current density ($Jcz2$) of the outer superconductor in the axial direction. Herein, the critical current density of the cylindrical superconductor (outer superconductor and inner superconductor) in the axial direction means a critical current density of a supercurrent flowing through the superconductor along the axial direction thereof, the critical current density thereof in the circumferential direction means a critical current density of a supercurrent flowing through the superconductor along the circumferential direction thereof, and the critical current density thereof in the radial direction means a critical current density of a supercurrent flowing through the superconductor along the radial direction thereof.

The critical current density Jc of the supercurrent flowing to the cylindrical superconductor is represented by the critical current density Jcz in the axial direction, the critical current density Jcr in the radial direction, and the critical current density $Jc\theta$ in the circumferential direction. Herein, the ratio ($Jc\theta/Jcz$) of the critical current density $Jc\theta$ in the circumferential direction to the critical current density Jcz in the axial direction represents the uniformity in the critical current density in the cylindrical circumferential surface. When the ratio ($Jc\theta/Jcz$) is close to 1, this represents the high uniformity in the critical current density in the cylindrical circumferential surface.

The superconducting magnetic field generating device according to the aspect of this disclosure includes the cylindrical outer superconductor and the cylindrical inner superconductor which is coaxially disposed on the inner circumferential side, and the outer superconductor and the inner superconductor are configured so that a ratio ($Jc\theta1/Jcz1$) regarding the critical current density of the supercurrent flowing through the inner superconductor is closer to 1 than the ratio ($Jc\theta2/Jcz2$) regarding the critical current density of the supercurrent flowing through the outer superconductor. That is, the uniformity in the critical current density of the inner superconductor in the cylindrical circumferential surface is higher than the uniformity in the critical current density of the outer superconductor in the cylindrical circumferential surface.

When the uniformity in the critical current density in the cylindrical circumferential surface is high, the supercurrent can describe a supercurrent loop having an arbitrary shape in an arbitrary position in the cylindrical circumferential surface. For example, it is possible to form a supercurrent loop which is formed by the supercurrent flowing around a central axis along the circumferential direction so as to be inclined with respect to the central axis, or a supercurrent loop which is formed by the supercurrent flowing through only a part of a region thereof in the circumferential direction, not around the central axis. In addition, it is possible to form a supercurrent loop having an arbitrary shape in the cylindrical circumferential surface.

Accordingly, since a supercurrent loop having an arbitrary shape is formed in an arbitrary position in the inner superconductor having high uniformity in the critical current density in the cylindrical circumferential surface, a magnetic field having arbitrary strength and a magnetic flux flowing in an arbitrary direction can be formed.

It is possible to correct the non-uniform trapped magnetic field using the characteristics of the inner superconductor. Specifically, when the outer superconductor and the inner superconductor to which the magnetic field having an axisymmetric magnetic field strength distribution in a bore of the superconductor and uniform magnetic field strength in the central portion is applied, are cooled to a temperature equal to or lower than the superconducting transition temperature, and the applied magnetic field is removed in that state, the supercurrent is induced in the outer superconductor. That is, the outer superconductor is magnetized. The supercurrent loop is formed in the outer superconductor due to the supercurrent induced in the outer superconductor. The trapped magnetic field is formed by forming the supercurrent loop in the outer superconductor. In addition, when the supercurrent loop formed in the outer superconductor is disordered due to the non-uniformity of the outer superconductor, the axial symmetry of the trapped magnetic field formed in the bore of the superconductor (inner superconductor) breaks down and the uniformity deteriorates. However, originally the trapped magnetic field is formed so as to reproduce the applied magnetic field, and accordingly, when the trapped magnetic field reproduced by forming the supercurrent loop in the outer superconductor is different from the applied magnetic field, the supercurrent is induced in the inner superconductor according to the magnetic field of the difference thereof. Herein, as described above, the inner superconductor can freely cause the supercurrent to flow into the cylindrical circumferential surface, and accordingly, it is possible to form the magnetic field having an arbitrary strength through which a magnetic flux passes in an arbitrary direction. That is, regardless of the type of the magnetic field of the difference, the supercurrent loop having an arbitrary shape is formed in an arbitrary position in the cylindrical circumferential surface in the inner superconductor, so that the magnetic field is formed according to the magnetic field described above. As a result, the non-uniform trapped magnetic field is trapped and the axial symmetry and the uniformity of the trapped magnetic field formed in the bore of the superconductor (inner superconductor) are maintained. Accordingly, according to the aspect of this disclosure, even in a case of using the superconducting bulk in the outer superconductor, it is possible to form the trapped magnetic field having high uniformity in the magnetic field strength in the axial direction, the circumferential direction, and the radial direction of the superconductor, that is, the trapped magnetic field having higher uniformity than that in the related art, in the bore of the superconductor (inner superconductor).

In the aspect of this disclosure, the high temperature superconducting material is a material which exhibits superconducting characteristics of second type superconductors having a superconducting transition temperature equal to or higher than 25 K, and can be exemplified by such as RE—Ba—Cu—O (RE is a rare earth element containing Y) based, Bi—Sr—Ca—Cu—O based, Hg—Ba—Ca—Cu—O based, Fe based or MgB2 based material. When the superconductor is manufactured using such a high temperature superconducting material, a precipitated phase (non-superconducting phase), impurities, a lattice defect, or a grain boundary which exhibits an effect as a pinning point is disposed to be dispersed therein.

In the aspect of this disclosure, the outer superconductor may be a superconducting bulk, that is, a massive superconductor. Particularly, when using an RE—Ba—Cu—O based superconducting bulk, it is possible to configure the outer superconductor with a fusion and growth body which is obtained by temporarily melting and growing a crystal of the superconducting material. The outer superconductor may be formed by laminating a thin film or a thick film in the axial direction. Meanwhile, the inner superconductor may be the superconducting bulk or the superconducting thin film or thick film, as long as it has the characteristics described above.

In the aspect of this disclosure, regarding the critical current density of the supercurrent flowing to the inner superconductor, the ratio ($Jc\theta 1/Jcz1$) of the critical current density $Jc\theta 1$ in the circumferential direction to the critical current density $Jcz1$ in the axial direction may be from 0.5 to 2. When the ratio ($Jc\theta 1/Jcz1$) is in the range described above, the uniformity in the critical current density in the cylindrical circumferential surface of the inner superconductor is high. Accordingly, the superconducting loop having an arbitrary shape is formed in an arbitrary position in the cylindrical circumferential surface of the inner superconductor, according to the disorder in the supercurrent loop formed in the outer superconductor. As a result, it is possible to form the trapped magnetic field having an axisymmetric magnetic field strength distribution and uniform magnetic field strength in the central portion in the bore of the superconductor (inner superconductor).

In this case, the outer superconductor and the inner superconductor may be formed with a high temperature superconductor having a layered crystal structure, a direction orthogonal to a layer of the crystal structure of the outer superconductor may coincide with the axial direction of the outer superconductor, and a direction orthogonal to a layer of the crystal structure of the inner superconductor may coincide with the radial direction of the inner superconductor. In a case of the crystal structure in which the direction orthogonal to a layer is the c axis direction (that is, the layered crystal structure having the c axis direction as a stacking direction), the critical current density is low in the c axis direction of the crystal structure and is high in the surface orthogonal to the c axis direction. The critical current density in the surface orthogonal to the c axis direction is comparatively uniform. Accordingly, when the c axis direction of the crystal structure of the inner superconductor coincides with the radial direction of the inner superconductor, the critical current density in the surface orthogonal to the radial direction, that is, in the cylindrical circumferential surface is set to be uniform. Therefore, it is possible to form the supercurrent loop having an arbitrary shape in an arbitrary position in the cylindrical circumferential surface of the inner superconductor.

The cooling device may include a cylindrical base material including a cylindrical portion coaxially disposed in an inner circumferential space of the outer superconductor. In addition, the inner superconductor may be configured to be cooled by receiving cold heat from the cylindrical portion. In this case, the inner superconductor may be formed in the cylindrical portion of the cylindrical base material. According to this, it is possible to cool the inner superconductor uniformly through the cylindrical base material. The cylindrical base material may be formed with non-magnetic metal (aluminum or copper) or sapphire (alumina single crystal) having high thermal conductivity.

The cooling device may include a cold head which is disposed so as to face one end surface of the outer superconductor, the cylindrical base material may include a fixing portion which extends in a radial shape from an outer circumferential surface of the cylindrical portion radially outwards, and the cylindrical base material may be cooled by the cold head and fixed to the cold head by causing the fixing portion to be interposed between one end surface of the outer superconductor and the cold head. According to this, the outer superconductor and the inner superconductor are cooled to substantially the same temperature through the cold head and the cylindrical base material.

The inner superconductor may be formed in a film shape on the outer circumferential surface or the inner circumferential surface of the cylindrical portion. By forming the inner superconductor in a film shape (thin film shape or thick film shape), it is possible to increase the uniformity of the material.

The inner superconductor may include a first inner superconducting layer which is a superconductor formed in a film shape and is formed in a cylindrical shape by being wound on an outer circumferential surface or inner circumferential surface of the cylindrical portion in the circumferential direction, and of which both end portions in the circumferential direction come in contact with each other, and a second inner superconducting layer which is a superconductor formed in a film shape and is formed in a cylindrical shape by being wound on the first inner superconducting layer in the circumferential direction, and of which both end portions in the circumferential direction come in contact with each other. The position of both end portions of the first inner superconducting layer in the circumferential direction and the position of both end portions of the second inner superconducting layer in the circumferential direction may be determined so that both end portions of the first inner superconducting layer in the circumferential direction and a region therebetween, and both end portions of the second inner superconducting layer in the circumferential direction and a region therebetween are disposed in different positions in the circumferential direction. Both ends of the first inner superconducting layer may come in contact with each other and both ends of the second inner superconducting layer may come in contact with each other.

According to this, by winding the plurality of film-shaped superconductors on the cylindrical portion of the cylindrical base material, it is possible to simply form the inner superconductor having a cylindrical shape. Among the supercurrent loops formed in the inner superconductor, the supercurrent loop passing through both end portions of the first inner superconducting layer in the circumferential direction is difficult to form in the first inner superconducting layer, but such a supercurrent loop is formed in the second inner superconducting layer. In the same manner as described above, among the supercurrent loops formed in the inner superconductor, the supercurrent loop passing through both end portions of the second inner superconducting layer in the circumferential direction is difficult to form in the second inner superconducting layer, but such a supercurrent loop is formed in the first inner superconducting layer. As described above, the supercurrent loop to be formed in a region, which is hardly formed in the first inner superconducting layer, is formed in the second inner superconducting layer, and the supercurrent loop to be formed in a region, which is difficult to form in the second inner superconducting layer, is formed in the first inner superconducting layer. As described above, since the supercurrent loops are formed so that the first inner superconducting layer and the second inner superconducting layer complement each other, it is possible to form the supercurrent loop having an arbitrary shape in an arbitrary position, other than a loop circulating around the axis of the inner superconductor.

The inner superconductor may be formed in a film shape and is wound on an outer circumferential surface or inner circumferential surface of the cylindrical portion to a length greater than one turn in the circumferential direction. According to this, by winding one film-shaped superconductor on the cylindrical portion of the cylindrical base material, it is possible to more simply form the cylindrical inner superconductor. In addition, the end portion positioned at the winding starting position of the inner superconductor is covered with a portion to be overlaid thereon. Accordingly, the supercurrent loop passing through the end portion positioned at the winding starting position is formed on a portion to be overlaid thereon. The end portion positioned in the winding ending position of the inner superconductor is positioned on the portion under which the inner superconductor is already wound. Accordingly, the supercurrent loop passing the end portion positioned at the winding ending position is formed on a portion under which the inner superconductor is wound. As described above, since the inner superconductor is wound on the cylindrical portion to a length greater than one turn so as to even form a supercurrent loop which is formed so as to pass the end portions (winding starting end portion and winding ending end portions) of the inner superconductor, it is possible to form the supercurrent loop having an arbitrary shape in an arbitrary position in the inner superconductor.

The inner superconductor may include a first inner superconducting thin strip and a second inner superconducting thin strip which are formed in a film shape and have a width smaller than the length of the cylindrical portion in the axial direction. The first inner superconducting thin strip may be wound on the outer circumferential surface or the inner circumferential surface of the cylindrical portion in a spiral shape by setting the axial direction of the cylindrical portion as a parallel advancing direction, and the second inner superconducting thin strip is wound on the first inner superconducting thin strip which is wound on the outer circumferential surface or the inner circumferential surface of the cylindrical portion in a spiral shape, by setting the axial direction of the cylindrical portion as a parallel advancing direction in a spiral shape. The first inner superconducting thin strip and the second inner superconducting thin strip are wound in a spiral shape so that a position of side edges of the first inner superconducting thin strip which is wound on the outer circumferential surface or the inner circumferential surface of the cylindrical portion in a spiral shape and a position of side edges of the second inner superconducting thin strip which is wound on the first inner superconducting thin strip in a spiral shape do not coincide with each other. In this case, the position of the side edges of the first inner superconducting thin strip and the position of the side edges of the second superconducting thin strip may deviate from each other in the axial direction of the cylindrical portion.

According to this, by winding the plurality of superconducting thin strips on the cylindrical portion of the cylindrical base material in a spiral shape, it is possible to simply form the inner superconductor. When the superconducting thin strips are wound on the cylindrical portion in a spiral shape, the side edges of the wound superconducting thin strip describe a spiral shape on the circumferential surface of the cylindrical portion. At that time, the first inner superconducting thin strip and the second inner superconducting thin strip are wound in a spiral shape so that the position of the side edges of the first inner superconducting thin strip and the position of the side edges of the second inner superconducting thin strip do not coincide with each other (do not overlap each other). Accordingly, the supercurrent loop passing the side edges of one superconducting thin strip is formed on the other superconducting thin strip. Therefore, it is possible to form the supercurrent loop having an arbitrary shape in an arbitrary position in the inner superconductor within a range of a width of a tape (superconducting thin strip).

The superconducting transition temperature Tci of the inner superconductor when the magnetic field may be applied to the superconductor is equal to or higher than the superconducting transition temperature Tco of the outer superconductor. The superconductor generates a non-uniform magnetic field by receiving the effect of the applied magnetic field and being magnetized, and the magnitude of the non-uniform magnetic field changes depending on the cooling temperature. Herein, when the temperature Tci is lower than the temperature Tco, even when the applied magnetic field is adjusted to be uniform when the temperature is decreased to a temperature immediately above the temperature Tco, the applied magnetic field is disordered due to the change of the non-uniform magnetic field which is generated by the outer superconductor while the temperature is decreased from the temperature Tco to the temperature Tci. The applied magnetic field which is disordered and not uniform as described above is then trapped by the inner superconductor which is cooled to the temperature Tci or lower and reaches the superconducting state. When the non-uniform magnetic field is trapped by the inner superconductor, it is difficult to sufficiently maintain the uniformity of the trapped magnetic field. With respect to this, the state of the inner superconductor first becomes the superconducting state, when the temperature Tci is equal to or higher than the temperature Tco. Accordingly, even when the non-uniform magnetic field generated from the outer superconductor changes when the temperature decreases from the temperature Tci to the temperature Tco, the non-uniform magnetic field is offset by causing the supercurrent to flow to the inner superconductor which is already in the superconducting state. Thus, it is possible to further increase the uniformity of the trapped magnetic field.

Another aspect of this disclosure provides a superconducting magnetic field generating method of generating a magnetic field using a superconductor which includes an outer superconductor which is formed with a high temperature superconducting material in a cylindrical shape and an inner superconductor which is formed with a high temperature superconducting material in a cylindrical shape and is coaxially disposed with the outer superconductor on the inner circumferential side of the outer superconductor, the method including: a magnetic field applying step of applying a magnetic field to the outer superconductor and the inner superconductor so that a magnetic flux passes through an inner circumferential space of the inner superconductor along the axial direction of the outer superconductor and the inner superconductor, a cooling step of cooling the outer superconductor and the inner superconductor to which the magnetic field is applied in the magnetic field applying step to a target temperature which is equal to or lower than a lower temperature among a superconducting transition temperature Tco of the outer superconductor and a superconducting transition temperature Tci of the inner superconductor, and a magnetic field trapping step of causing the superconductor to trap the applied magnetic field by removing the magnetic field applied to the outer superconductor and the inner superconductor which are cooled to the target temperature, in which the inner superconductor is formed so that a ratio ($Jc\theta1/Jcz1$) of a critical current density ($Jc\theta1$) in the circumferential direction to a critical current density ($Jcz1$) of the inner superconductor in the axial direction is closer to 1 than a ratio ($Jc\theta2/Jcz2$) of the critical current density ($Jc\theta2$) in the circumferential direction to a critical current density ($Jcz2$) of the outer superconductor in the axial direction.

A superconducting magnetic field generating method according to the aspect of this disclosure realizes the same operational effects as the operational effects shown with the superconducting magnetic field generating device according to the aspect of this disclosure. Therefore, according to the aspect of this disclosure, it is possible to form the trapped magnetic field having an axisymmetric magnetic field strength distribution and high uniformity thereof in the central portion in the bore of the superconductor (inner superconductor).

In this case, the method further includes a step executed during the cooling step which is a magnetic field adjustment step of adjusting the magnetic field applied to the outer superconductor and the inner superconductor so that a magnetic field space having uniform magnetic field strength in the axial direction and the radial direction of the inner superconductor is formed in an inner circumferential space (bore) of the inner superconductor, when the inner superconductor and the outer superconductor are cooled to a temperature before reaching superconducting Ts which is a temperature slightly higher than the higher temperature among the superconducting transition temperature Tco of the outer superconductor and the superconducting transition temperature Tci of the inner superconductor. According to this, by adjusting the applied magnetic field so as to have uniform magnetic field strength in the bore (particularly, in a bore at room temperature) when the temperature of the superconductor is decreased to a temperature immediately before reaching the superconducting state, the non-uniform magnetic field generated before that point is removed. Therefore, it is possible to further increase the uniformity of the trapped magnetic field trapped when the applied magnetic field is removed.

Still another aspect of this disclosure provides a nuclear magnetic resonance apparatus including the superconducting magnetic field generating device according to this disclosure. According to this, it is possible to increase the uniformity of the magnetic field formed in a space where a sample is placed, and therefore, it is possible to improve accuracy of analysis of the molecular structure of the sample.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A superconducting magnetic field generating device comprising:

a superconductor which includes an outer superconductor which is formed with a high temperature superconducting material in a cylindrical shape and generates a trapped magnetic field by trapping an applied magnetic field in a state of being cooled to a temperature equal to or lower than a superconducting transition temperature, and an inner superconductor which is formed with a high temperature superconducting material in a cylindrical shape and is coaxially disposed with the outer superconductor on the inner circumferential side of the outer superconductor; and a cooling device which cools the outer superconductor and the inner superconductor to a temperature equal to or lower than the superconducting transition temperature, wherein the inner superconductor is formed so that a ratio ($Jc\theta1/Jcz1$) of a critical current density ($Jc\theta1$) of the inner superconductor in the circumferential direction to a critical current density ($Jcz1$) of the inner superconductor in the axial direction is closer to 1 than a ratio ($Jc\theta2/Jcz2$) of the critical current density ($Jc\theta2$) of the outer superconductor in the circumferential direction to a critical current density ($Jcz2$) of the outer superconductor in the axial direction.

2. The superconducting magnetic field generating device according to claim 1, wherein the ratio ($Jc\theta1/Jcz1$) is from 0.5 to 2.

3. The superconducting magnetic field generating device according to claim 1, wherein the outer superconductor and the inner superconductor are formed with high temperature superconductors having a layered crystal structure, a direction orthogonal to a layer of the crystal structure of the outer superconductor coincides with the axial direction of the outer superconductor, and a direction orthogonal to a layer of the crystal structure of the inner superconductor coincides with the radial direction of the inner superconductor.

4. The superconducting magnetic field generating device according to claim 1, wherein the cooling device includes a cylindrical base material including a cylindrical portion coaxially disposed in an inner circumferential space of the outer superconductor, and the inner superconductor is configured to be cooled by receiving cold heat from the cylindrical portion.

5. The superconducting magnetic field generating device according to claim 4, wherein the cooling device includes a cold head which is disposed so as to face one end surface of the outer superconductor, the cylindrical base material includes a fixing portion which extends in a radial shape from an outer circumferential surface of the cylindrical portion to radially outside, and the cylindrical base material is cooled by the cold head and is fixed to the cold head by causing the fixing portion to be interposed between one end surface of the outer superconductor and the cold head.

6. The superconducting magnetic field generating device according to claim 4, wherein the inner superconductor is formed in a film shape on the outer circumferential surface or the inner circumferential surface of the cylindrical portion.

7. The superconducting magnetic field generating device according to claim 4, wherein the inner superconductor includes a first inner superconducting layer which is a superconductor formed in a film shape and is formed in a cylindrical shape by being wound on an outer circumferential surface or inner circumferential surface of the cylindrical portion in the circumferential direction, and of which both end portions in the circumferential direction come in contact with each other, and a second inner superconducting layer which is a superconductor formed in a film shape and is formed in a cylindrical shape by being wound on the first inner superconducting layer in the circumferential direction, and of which both end portions in the circumferential direction come in contact with each other, and the position of both end portions of the first inner superconducting layer in the circumferential direction and the position of both end portions of the second inner superconducting layer in the circumferential direction are determined so that both end portions of the first inner superconducting layer in the circumferential direction and a region therebetween, and both end portions of the second inner superconducting layer in the circumferential direction and a region therebetween are disposed in different positions in the circumferential direction.

8. The superconducting magnetic field generating device according to claim 4, wherein the inner superconductor is formed in a film shape and is wound on an outer circumferential surface or inner circumferential surface of the cylindrical portion more than once round in the circumferential direction.

9. The superconducting magnetic field generating device according to claim 4, wherein the inner superconductor includes a first inner superconducting thin strip and a second inner superconducting thin strip which are formed in a film shape and have a width smaller than the length of the cylindrical portion in the axial direction, the first inner superconducting thin strip is wound on the outer circumferential surface or the inner circumferential surface of the cylindrical portion in a spiral shape by setting the axial direction of the cylindrical portion as a parallel advancing direction, the second inner superconducting thin strip is wound on the first inner superconducting thin strip which is wound on the outer circumferential surface or the inner circumferential surface of the cylindrical portion in a spiral shape, by setting the axial direction of the cylindrical portion as a parallel advancing direction in a spiral shape, and the first inner superconducting thin strip and the second inner superconducting thin strip are wound in a spiral shape so that a position of side edges of the first inner superconducting thin strip which is wound on the outer circumferential surface or the inner circumferential surface of the cylindrical portion in a spiral shape and a position of side edges of the second inner superconducting thin strip which is wound on the first inner superconducting thin strip in a spiral shape do not coincide with each other.

10. The superconducting magnetic field generating device according to claim 1, wherein a superconducting transition temperature $Tci$ of the inner superconductor when the magnetic field is applied to the superconductor is equal to or higher than a superconducting transition temperature Tco of the outer superconductor.

11. A nuclear magnetic resonance apparatus comprising the superconducting magnetic field generating device according to claim 1.

12. A superconducting magnetic field generating method of generating a magnetic field using a superconductor which includes an outer superconductor which is formed with a high temperature superconducting material in a cylindrical shape and an inner superconductor which is formed with a high temperature superconducting material in a cylindrical shape and is coaxially disposed with the outer superconductor on the inner circumferential side of the outer superconductor, the method comprising:

a magnetic field applying step of applying a magnetic field to the outer superconductor and the inner superconductor so that a magnetic flux passes through an inner circumferential space of the inner superconductor along the axial direction of the outer superconductor and the inner superconductor, a cooling step of cooling the outer superconductor and the inner superconductor to which the magnetic field is applied in the magnetic field applying step to a target temperature which is equal to or lower than a lower temperature among a superconducting transition temperature Tco of the outer superconductor and a superconducting transition temperature Tci of the inner superconductor, and a magnetic field trapping step of causing the superconductor to trap the applied magnetic field by removing the magnetic field applied to the outer superconductor and the inner superconductor which are cooled to the target temperature, wherein the inner superconductor is formed so that a ratio (Jc$\theta$1/Jcz1) of a critical current density (Jc$\theta$1) of the inner superconductor in the circumferential direction to a critical current density (Jcz1) of the inner superconductor in the axial direction is closer to 1 than a ratio (Jc$\theta$2/Jcz2) of the critical current density (Jc$\theta$2) of the outer superconductor in the circumferential direction to a critical current density (Jcz2) of the outer superconductor in the axial direction.

13. The superconducting magnetic field generating method according to claim 12, further comprising:

a step executed during the cooling step which is a magnetic field adjustment step of adjusting the magnetic field applied to the outer superconductor and the inner superconductor so that a magnetic field space having uniform magnetic field strength in the axial direction and the radial direction of the inner superconductor is formed in an inner circumferential space of the inner superconductor, when the inner superconductor and the outer superconductor are cooled to a temperature before reaching superconducting Ts which is a temperature slightly higher than the higher temperature among the superconducting transition temperature Tco of the outer superconductor and the superconducting transition temperature Tci of the inner superconductor.

* * * * *